US012550308B2

(12) United States Patent
Imada

(10) Patent No.: US 12,550,308 B2
(45) Date of Patent: Feb. 10, 2026

(54) COMPONENT MOUNTING SYSTEM

(71) Applicant: YAMAHA HATSUDOKI KABUSHIKI KAISHA, Iwata (JP)

(72) Inventor: Hikaru Imada, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 674 days.

(21) Appl. No.: 17/998,747

(22) PCT Filed: May 20, 2020

(86) PCT No.: PCT/JP2020/019909
§ 371 (c)(1),
(2) Date: Nov. 14, 2022

(87) PCT Pub. No.: WO2021/234848
PCT Pub. Date: Nov. 25, 2021

(65) Prior Publication Data
US 2023/0189494 A1   Jun. 15, 2023

(51) Int. Cl.
*H05K 13/08* (2006.01)
*H05K 13/04* (2006.01)

(52) U.S. Cl.
CPC ..... *H05K 13/0882* (2018.08); *H05K 13/0409* (2018.08); *H05K 13/0413* (2013.01); *H05K 13/0812* (2018.08)

(58) Field of Classification Search
CPC ........... H05K 13/0409; H05K 13/0413; H05K 13/0812; H05K 13/0815; H05K 13/083; H05K 13/0882
See application file for complete search history.

(56) References Cited

U.S. PATENT DOCUMENTS

2008/0046210 A1   2/2008   Murakami
2017/0252880 A1*  9/2017   Okada ................... H04N 23/57
(Continued)

FOREIGN PATENT DOCUMENTS

CN   107926145 A    4/2018
JP   861-293000 A  12/1986
(Continued)

OTHER PUBLICATIONS

An Office Action; mailed by the China National Intellectual Property Administration of the People's Republic of China on Jan. 16, 2025, which corresponds to Chinese Patent Application No. 202080100809.5 and is related to U.S. Appl. No. 17/998,747; with English Summary.

(Continued)

*Primary Examiner* — Minh N Trinh
(74) *Attorney, Agent, or Firm* — Studebaker Brackett PLLC

(57) ABSTRACT

A component mounting system is a system in which a mounting machine and an inspection device are connected to a management device so as to enable data communication therewith. The mounting machine includes a mounting analysis unit that acquires suction position shift data for each component mounting operation of a mounting head. The inspection device includes an inspection analysis unit that acquires mounting position shift data corresponding to each of a plurality of target mounting positions. The management device includes a mark generating unit and a display unit. Based on each suction position shift data and each mounting position shift data, the mark generating unit generates a suction shift mark and a mounting shift mark each of which visualizes the direction and the size of a positional shift. The display unit displays each suction shift mark or each mounting shift mark at each marking position on board graphics.

6 Claims, 15 Drawing Sheets

(56) References Cited

U.S. PATENT DOCUMENTS

| | | | |
|---|---|---|---|
| 2017/0325370 A1* | 11/2017 | Nozawa | H05K 13/0413 |
| 2018/0242486 A1 | 8/2018 | Sugita et al. | |
| 2021/0233226 A1 | 7/2021 | Sugiyama et al. | |
| 2023/0189494 A1* | 6/2023 | Imada | H05K 13/0815 |
| | | | 414/416.02 |

FOREIGN PATENT DOCUMENTS

| | | | |
|---|---|---|---|
| JP | 2008-010666 A | 1/2008 | |
| JP | 2009-016673 A | 1/2009 | |
| JP | 2011-086695 A | 4/2011 | |
| WO | 2018/100717 A1 | 6/2018 | |
| WO | WO-2021234848 A1 * | 11/2021 | H05K 13/083 |

OTHER PUBLICATIONS

International Search Report issued in PCT/JP2020/019909; mailed Jul. 14, 2020.

* cited by examiner

COMPONENT MOUNTING SYSTEM

CROSS-REFERENCE TO RELATED APPLICATION

This application is a National Stage of International Patent Application No. PCT/JP2020/019909, filed May 20, 2020, the entire content of which is incorporated herein by reference.

BACKGROUND

Technical Field

The present disclosure relates to a component mounting system including a mounting machine that produces a component mounting board carrying components mounted thereon.

Background Art

A component mounting system has been known for years, which includes a mounting machine that mounts electronic components (hereinafter, simply referred to as "components") on a board, such as printed board, to produce a component mounting board. In this type of component mounting system, the mounting machine is provided with a mounting head that carries out a component mounting operation of sucking and holding a component by a suction nozzle and mounting the component on a board. The mounting head carries out the component mounting operation correspondingly at each of a plurality of target mounting positions preset on the board.

The component mounting operation by the mounting head may give rise to a positional shift between an actual suction position, at which the component is actually sucked by the suction nozzle, and a target suction position. Such a positional shift of the suction position could be a cause of a shift of an actual mounting position, at which the component is actually mounted on the board, relative to a target mounting position. When a shift of the actual mounting position of the component arises on the board, it affects the quality of the component mounting board produced by the mounting machine.

JP 2008-10666 A discloses a technique related to an inspection device that inspects a component mounting board. The inspection device inspects an amount of positional shift of the actual mounting position of a component on the component mounting board, and determines whether the amount of positional shift makes the component defective or not, based on an evaluation reference value. According to the technique disclosed in JP 2008-10666 A, evaluation reference value setting is optimized, based on a histogram indicating a distribution of amounts of positional shift acquired through the inspection by the inspection device.

The technique disclosed in JP 2008-10666 A allows confirming a distribution of positional shifts of actual mounting positions of components on the component mounting board. The technique, however, does not allow confirming a tendency of mounting position shifts across the whole board, and does not allow confirming a tendency of positional shift of actual suction positions of components sucked by the suction nozzle, either, which positional shift of actual suction positions could be a cause of a mounting position shift. For these reasons, it is difficult to take proper measures for eliminating problems caused by positional shifts of actual mounting positions of components on the board.

SUMMARY

The present disclosure has been made in view of the above circumstances, and therefore provides a component mounting system that allows confirming a tendency of suction position shifts and of mounting position shifts on a board as a whole.

A component mounting system according to an aspect of the present disclosure is a system including a mounting machine that produces a component mounting board carrying components mounted on the board; an inspection device that inspects the component mounting board; and a management device connected to the mounting machine and the inspection device so as to enable data communication with the mounting machine and the inspection device. In this component mounting system, the mounting machine includes a mounting stage that holds the board; a mounting head having a suction nozzle capable of sucking and holding the component, the mounting head carrying out a component mounting operation of mounting the component sucked and held by the suction nozzle on the board on the mounting stage, correspondingly at each of a plurality of target mounting positions set on the board; a mounting analysis unit that analyzes a suction position shift indicating a positional shift of an actual suction position of the component relative to a target suction position, the positional shift being caused by the suction nozzle, to acquire suction position shift data on the suction position shift for the each component mounting operation by the mounting head; and a mounting output unit that outputs the each suction position shift data for the each component mounting operation. The inspection device includes an inspection analysis unit that analyzes each mounting position shift indicating a positional shift of an actual mounting position of the component relative to each of the plurality of target mounting positions on the component mounting board obtained by the component mounting operation by the mounting head, to acquire each mounting position shift data on the mounting position shift; and an inspection output unit that outputs the each mounting position shift data. The management device includes a mark generating unit that generates each suction shift mark visualizing a direction and a size of the each suction position shift indicated by the each suction position shift data and each mounting shift mark visualizing a direction and a size of the each mounting position shift indicated by the each mounting position shift data; and a display unit that displays board graphics corresponding to the board, the display unit displaying the each suction shift mark or the each mounting shift mark at each marking position corresponding to each of the plurality of target mounting positions on the board graphics.

The object, features, and advantages of the present disclosure will be made clear through the following detailed description and the accompanying drawings.

DETAILED DESCRIPTION

A component mounting system according to embodiments of the present disclosure will hereinafter be described with reference to the drawings.

Figure 1:
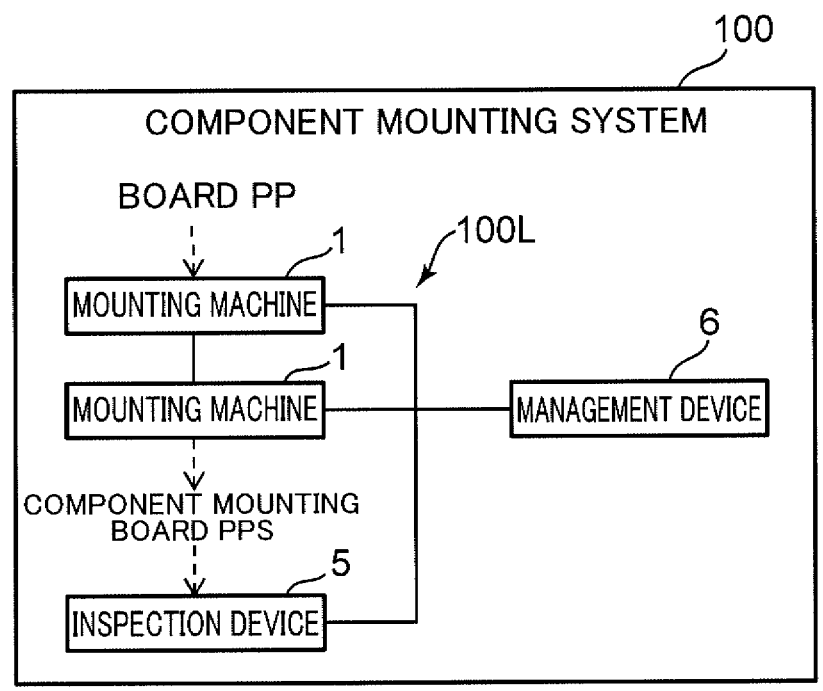
FIG. 1 depicts an overall configuration of a component mounting system according to an embodiment of the present disclosure.

FIG. 1 depicts an overall configuration of a component mounting system 100 according to an embodiment of the present disclosure. The component mounting system 100 includes a component mounting line 100L formed of mounting machines 1 and an inspection device 5 that are connected to each other, and a management device 6.

In the component mounting line 100L, the mounting machines 1 and the inspection device 5 are connected to each other by a connecting conveyor such that they are lined up along a transfer direction of a board PP, such as a printed board, and that the inspection device 5 is disposed downstream relative to the mounting machine 1 in the transfer direction. The mounting machine 1 is an apparatus that produces component mounting boards PPS each carrying electronic components (hereinafter, referred to as "component") mounted on the board PP. The number of mounting machines 1 making up the component mounting line 100L is not limited particularly. One mounting machine 1 or two or more mounting machines 1 may be arranged. A component mounting board PPS produced by the mounting machine 1 is conveyed to the inspection device 5. The inspection device 5 is a device that inspects the component mounting board PPS. The management device 6 is a device that is connected to the mounting machine 1 and the inspection device 5 so as to enable data communication therewith.

Figure 2:
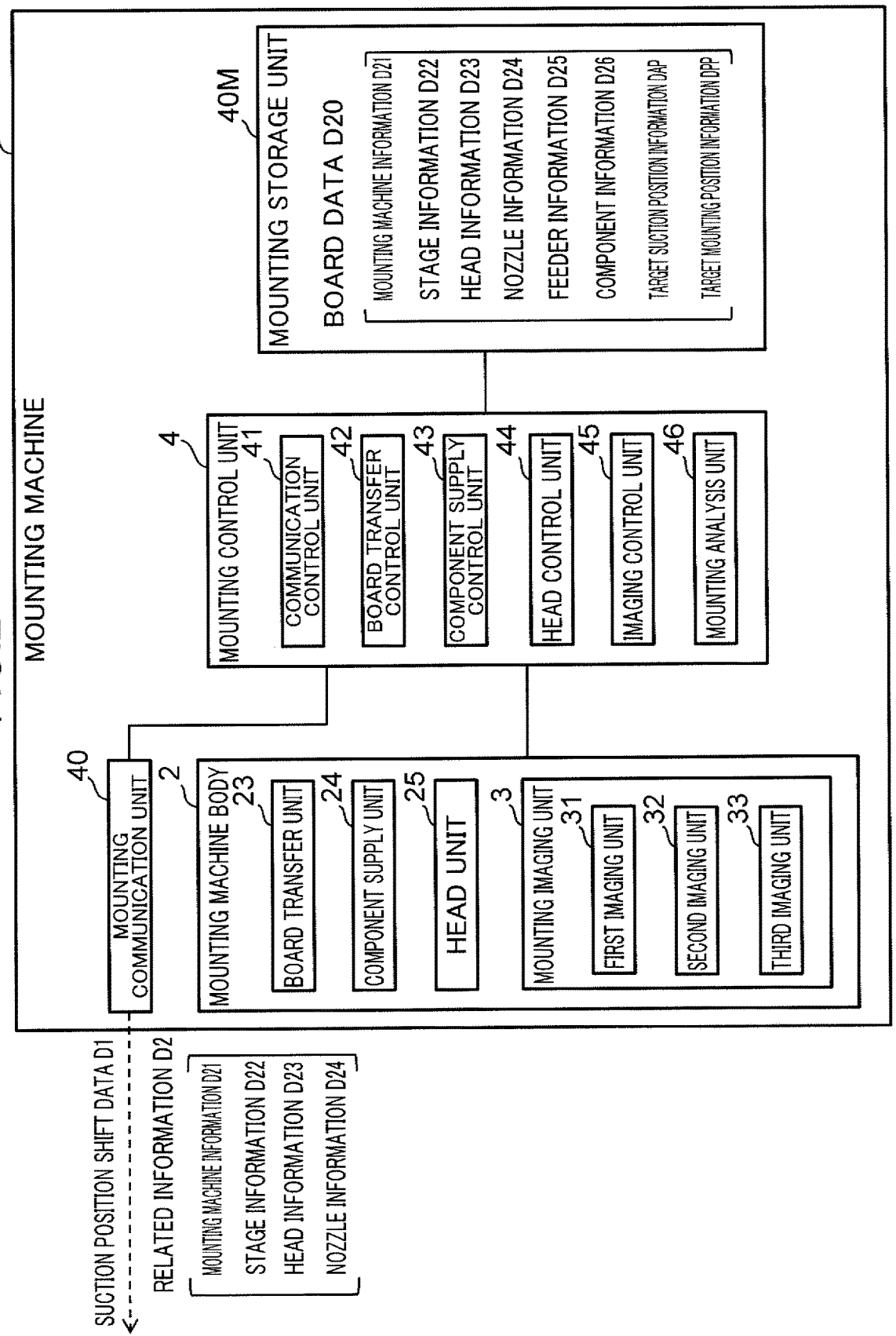
FIG. 2 is a block diagram of a mounting machine included in the component mounting system.
Figure 3:
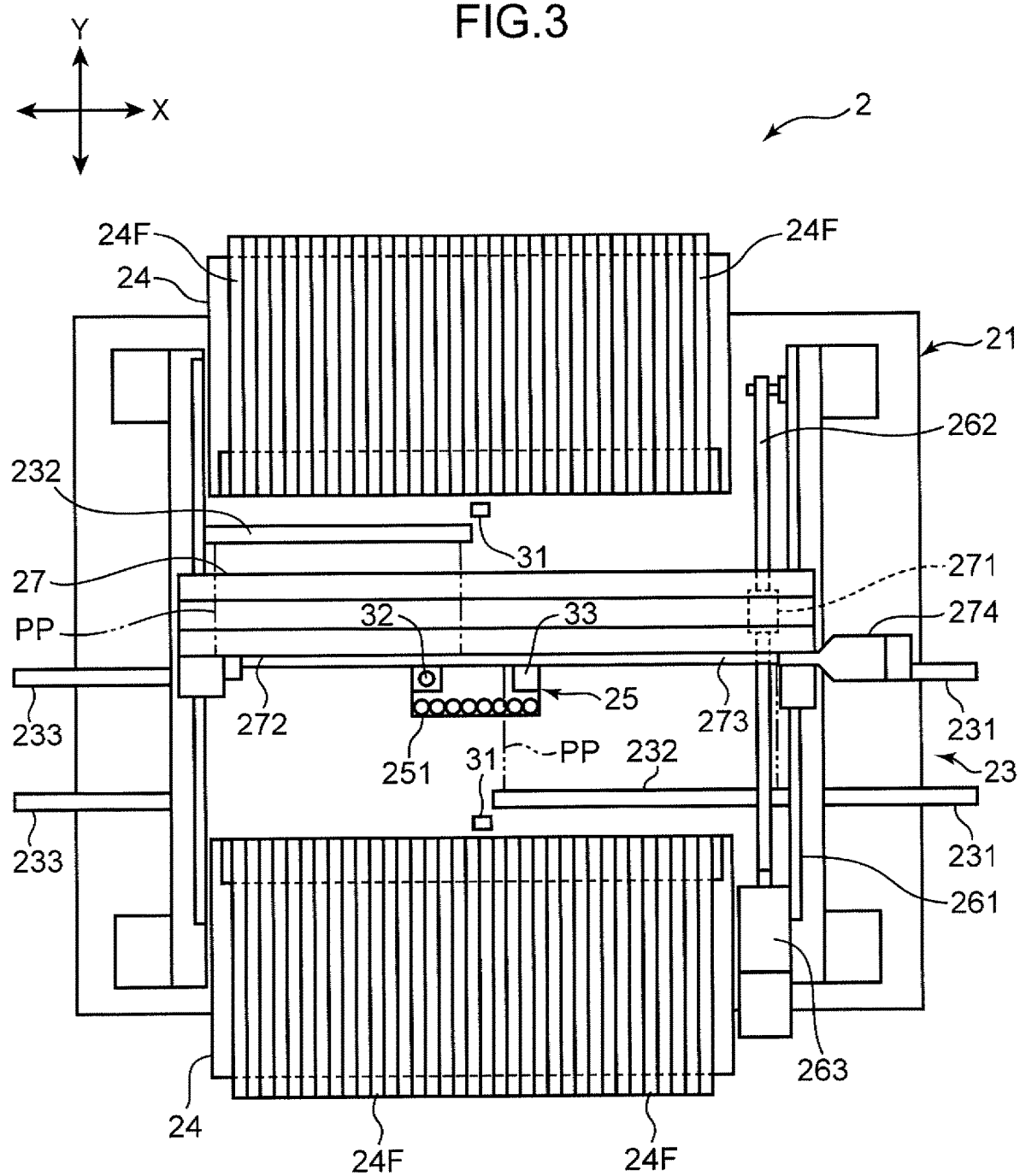
FIG. 3 is a plan view of a configuration of a mounting machine body of the mounting machine.
Figure 4:
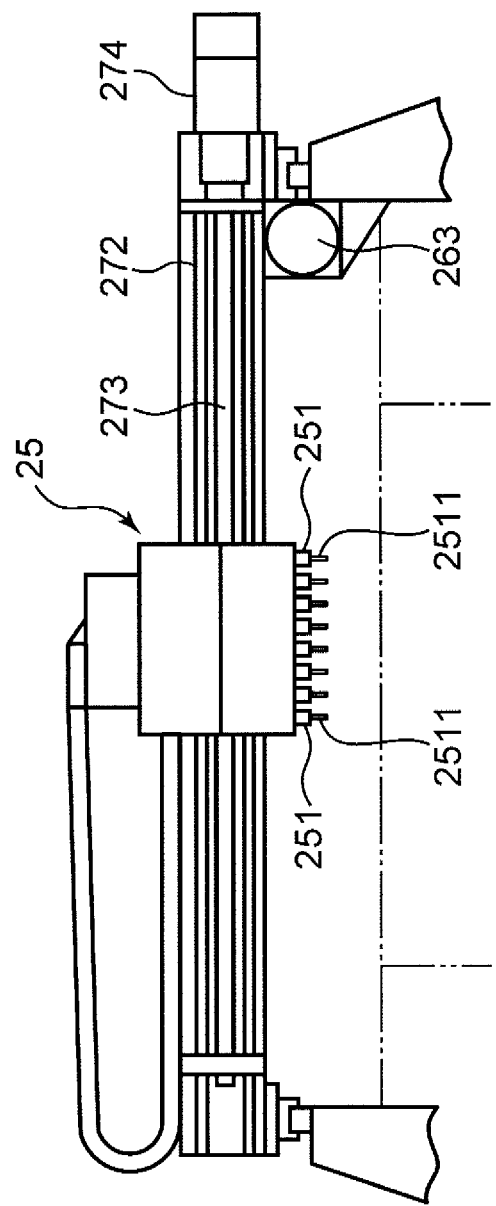
FIG. 4 is an enlarged view of a part of a head unit of the mounting machine body.

The mounting machine 1 included in the component mounting system 100 will be described with reference to FIGS. 2 to 4. FIG. 2 is a block diagram of the mounting machine 1, FIG. 3 is a plan view of a configuration of a mounting machine body 2 of the mounting machine 1, and FIG. 4 is an enlarged view of a part of a head unit 25 of the mounting machine body 2. In FIG. 3, a directional relationship is indicated by using XY orthogonal coordinates defined by the X-axis and the Y-axis orthogonal to each other on a horizontal plane.

The mounting machine 1 includes the mounting machine body 2, a mounting control unit 4, a mounting communication unit 40, and a mounting storage unit 40M. The mounting machine body 2 makes up a structure that when producing the component mounting board PPS, carries out a component mounting operation of mounting a component on the board PP. The mounting communication unit 40 is an interface that carries out data communication with the management device 6, functioning as a mounting output unit that outputs various pieces of data and information to the management device 6. The mounting control unit 4 controls the component mounting operation and the like of the mounting machine body 2 according to board data D20 stored in the mounting storage unit 40M, and controls a data communication operation of the mounting communication unit 40 as well.

Before component mounting by the mounting machine body 2, the board PP is printed with a solder paste pattern. In other words, the mounting machine body 2 mounts a component on the board PP having the solder paste pattern printed by a pattern forming device. The mounting machine body 2 includes a body frame 21, a board transfer unit 23, component supply units 24, and the head unit 25.

The body frame 21 is a structure in which units making up the mounting machine body 2 are arranged. The body frame 21 is of a substantially rectangular shape in a plan view in a direction (vertical direction) perpendicular to an X-axis direction and to a Y-axis direction. The board transfer unit 23 is disposed on the body frame 21, and transfers the board PP in the X-axis direction. The board transfer unit 23 includes a carry-in unit 231, a plurality of mounting stages 232, and a carry-out unit 233 which are arranged in order from the upstream side to the downstream side in the transfer direction of the board PP. The carry-in unit 231 receives the board PP from a board transfer path of a device on the upstream side, and delivers the board PP to the mounting stage 232. The carry-in unit 231 functions as a buffer conveyor that causes the board PP to stand by so that a time lag is created between a point of reception of the board PP and a point of delivery of the same. Each mounting stage 232 is formed of, for example, a pair of conveyors, and positions and holds the board PP at a given operation position (component mounting position at which a component is mounted on the board PP). As the board PP is held on each mounting stage 232, a component is mounted on the board PP. When an operation of mounting a component on the board PP on each mounting stage 232 is over, the mounting stage 232 delivers the board PP to the carry-out unit 233. The carry-out unit 233 receives the board PP from the mounting stage 232, and delivers the board PP to a board transfer path of a device on the downstream side. The carry-out unit 233 functions as a buffer conveyor that causes the board PP to stand by so that a time lag is created between a point of reception of the board PP and a point of delivery of the same.

The component supply units 24 are disposed respectively in both end areas in the Y-axis direction of the body frame 21, with the board transfer unit 23 interposed between the component supply units 24. Each component supply unit 24 is attached to an area of the body frame 21, with a plurality of feeders 24F being lined up side by side in the component supply unit 24. In the component supply unit 24, a set position of each feeder 24F is demarcated for each component to be held by a mounting head 251 included in the head unit 25, which will be described later. The feeder 24F is attached detachably to the component supply unit 24. The feeder 24F is not limited to a particular type of feeder, and may be any type of feeder that can hold a plurality of components and feed the held components to a given component feeding position set in the feeder. For example, the feeder 24F is provided as a tape feeder. The tape feeder is a feeder configured to have a reel wound with a component storage tape having components stored therein at intervals and to reel out the component storage tape from the reel to supply components.

The head unit 25 is held by a moving frame 27. A fixed rail 261 extending in the Y-axis direction and a ball screw shaft 262 caused to rotate by a Y-axis servo motor 263 are disposed on the body frame 21. The moving frame 27 is disposed on the fixed rail 261, and a nut portion 271 formed on the moving frame 27 is screwed on the ball screw shaft 262. The moving frame 27 is provided with a guide member 272 extending in the X-axis direction and with a ball screw shaft 273 driven by an X-axis servo motor 274. The head unit 25 is held movably by the guide member 272, and a nut portion formed on the head unit 25 is screwed on the ball screw shaft 273. The Y-axis servo motor 263 operates to move the moving frame 27 in the Y-axis direction, and the X-axis servo motor 274 operates to move the head unit 25 in the X-axis direction along the moving frame 27. In other words, the head unit 25 is able to move in the Y-axis direction as a result of movement of the moving frame 27 in the Y-axis direction, and is able to move in the X-axis direction as well along the moving frame 27. The head unit 25 can move between the component supply unit 24 and the board PP held on the mounting stage 232. The head unit 25 moves between the component supply unit 24 and the board PP, thereby executing a component mounting operation of mounting a component on the board PP.

As shown in FIG. 4, the head unit 25 includes a plurality of mounting heads 251. Each mounting head 251 has a suction nozzle 2511 attached to its front end (lower end). The suction nozzle 2511 is a nozzle capable of sucking and holding a component fed by the feeder 24F. The suction nozzle 2511 can communicate with a negative pressure generation device or a positive pressure generation device or the fresh air, via an electric selector valve. Specifically, supplying the suction nozzle 2511 with a negative pressure allows the suction nozzle 2511 to suck and hold a component, and then supplying the suction nozzle 2511 with a positive pressure causes the suction nozzle 2511 to release the component. Each mounting head 251 carries out a component mounting operation of mounting the component sucked and held by the suction nozzle 2511 on the board PP, correspondingly at each of a plurality of target mounting positions set on the board PP.

Each mounting head 251 can move up and down in a Z-axis direction (vertical direction) with respect to the frame of the head unit 25, and can rotate around a head shaft extending in the Z-axis direction. Each mounting head 251 can move up and down along the Z-axis direction between a suction enabling position, at which the suction nozzle 2511 is able to suck and hold a component, and a retreated position located above the suction enabling position. Specifically, when the suction nozzle 2511 sucks and holds a component, each mounting head 251 moves down from the retreated position toward the suction enabling position to suck and hold the component at the suction enabling position. After sucking and holding the component, each mounting head 251 moves up from the suction enabling position toward the retreated position. Each mounting head 251 can also move up and down along the Z-axis direction between a mounting enabling position, at which the mounting head 251 is able to mount the component having been sucked and held by the suction nozzle 2511 on a preset target mounting position on the board PP, and the retreated position.

As shown in FIGS. 2 and 3, the mounting machine body 2 further includes a mounting imaging unit 3. The mounting imaging unit 3 carries out an imaging operation, that is, photographs an object, thereby obtaining an image of the object. The mounting imaging unit 3 includes a first imaging unit 31, a second imaging unit 32, and a third imaging unit 33.

The first imaging unit 31 is an imaging camera that is disposed between the component supply unit 24 and the board transfer unit 23 on the body frame 21 and that is equipped with an imaging element, such as a complementary metal-oxide-semiconductor (CMOS) or a charge-coupled device (CCD). When each mounting head 251 is executing the component mounting operation, as the head unit 25 moves from the component supply unit 24 toward the board PP held on the mounting stage 232, the first imaging unit 31 photographs a component sucked and held by the suction nozzle 2511 of each mounting head 251, from below to obtain a first component recognition image. The first component recognition image obtained by the first imaging unit 31 is input to the mounting control unit 4, which will be to described later, and is referred to by a mounting analysis unit 46 when it analyzes a suction position shift.

The second imaging unit 32 is an imaging camera that is disposed on the head unit 25 and that is equipped with an imaging element, such as a CMOS or a CCD. When each mounting head 251 is executing the component mounting operation, the second imaging unit 32 photographs various marks made on an upper surface of the board PP held on the mounting stage 232, from above to recognize the marks. By recognition of the marks on the board PP by the second imaging unit 32, an amount of a positional shift of the board PP relative to the origin coordinates is detected.

The third imaging unit 33 is an imaging camera that is disposed on the head unit 25 and that is equipped with an imaging element, such as a CMOS or a CCD. When each mounting head 251 is executing the component mounting operation, the third imaging unit 33 photographs a component sucked and held by the suction nozzle 2511, from the side of the component right before the component is mounted on the board PP, thereby obtaining a second component recognition image. By the second component recognition image obtained by the third imaging unit 33, dropping of the component from the suction nozzle 2511 right before being mounted on the board PP is detected.

The mounting storage unit 40M stores board data D20 referred to by the mounting control unit 4. The board data D20 is data composed of a plurality of parameters necessary for controlling the component mounting operation of the mounting machine body 2 by the mounting control unit 4. The board data D20 includes a plurality of pieces of parameter information mounting machine information D21, stage information D22, head information D23, nozzle information D24, feeder information D25, component information D26, target suction position information DAP, and target mounting position information DPP.

The mounting machine information D21 is information in which parameters for specifying the type of the mounting machine 1 are recorded. The stage information D22 is information in which parameters for specifying the type of the mounting stage 232 are recorded. In the stage information D22, such a parameter as a number for the mounting stage 232 is recorded as a parameter for specifying the type of the mounting stage 232. The head information D23 is information in which parameters for specifying the type of the mounting head 251 are recorded. In the head information D23, such a parameter as a number for the mounting head 251 is recorded as a parameter for specifying the type of the mounting head 251. The nozzle information D24 is information in which parameters for specifying the type of the suction nozzle 2511 are recorded. In the nozzle information D24, such parameters as the type of the suction nozzle 2511 and an identifier for the suction nozzle 2511 are recorded as parameters for specifying the type of the suction nozzle 2511. The feeder information D25 is information in which parameters for specifying the type of the feeder 24F are recorded. In the feeder information D25, such parameters as the type of the feeder 24F and a set position of the feeder 24F in the component supply unit 24 are recorded as parameters for specifying the type of the feeder 24F. The component information D26 is information in which parameters for specifying the type of a component to be mounted on the board PP are recorded. In the component information D26, such parameters as a component name indicating the type of the component, outline dimensions of the component in the X-axis and the Y-axis directions, and the thickness of the component are recorded as parameters for specifying the type of the component.

The target suction position information DAP is information in which a suction position that the suction nozzle 2511 aims at upon sucking a component (target suction position) is recorded as a parameter. In the target suction position information DAP, respective coordinates in the X-axis and Y-axis directions of the target suction position of a component with respect to the suction nozzle 2511 are registered as parameters. The target suction position is usually set at a central position on a sucked surface of the component. The target mounting position information DPP is information in which the target mounting position of a component, the target mounting position being set on the board PP, is recorded as a parameter. In the target mounting position information DPP, respective coordinates in the X-axis and Y-axis directions of the target mounting position on the board PP are registered as parameters.

The mounting control unit 4 includes a central processing unit (CPU), a read-only memory (ROM) storing control programs, and a random access memory (RAM) used as a work area for the CPU. As a result of the CPU's executing control programs stored in the ROM, the mounting control unit 4 controls operations of respective components of the mounting machine body 2 and a data communication operation of the mounting communication unit 40, and executes various computations as well. The mounting control unit 4 controls operations of respective components of the mounting machine body 2 according to the board data D20 stored in the mounting storage unit 40M. As shown in FIG. 2, the mounting control unit 4 includes, as main functional constituent elements, a communication control unit 41, a board transfer control unit 42, a component supply control unit 43, a head control unit 44, an imaging control unit 45, and a mounting analysis unit 46.

The communication control unit 41 controls the mounting communication unit 40, thereby controlling data communication between the mounting machine 1 and the management device 6. The mounting communication unit 40 controlled by the communication control unit 41 outputs each suction position shift data D1 acquired by the mounting analysis unit 46, which will be described later, and the related information D2, to the management device 6. The suction position shift data D1, which will be described in detail later, is data acquired by the mounting analysis unit 46 for each component mounting operation by the mounting head 251, and is data on a suction position shift indicating a positional shift of a suction position at which the suction nozzle 2511 actually sucks a component (actual suction position), relative to a target suction position indicated by the target suction position information DAP.

The related information D2 is composed of a plurality of pieces of parameter information associated respectively with pieces of suction position shift data D1. The plurality of pieces of parameter information are included in the board data D20 stored in the mounting storage unit 40M. The plurality of pieces of parameter information making up the related information D2 includes the mounting machine information D21, the stage information D22, the head information D23, and the nozzle information D24, which make up part of the board data D20. At execution of one component mounting operation by the mounting head 251 equipped in the mounting machine 1, one mounting stage 232 out of a plurality of mounting stages 232 is used, one mounting head 251 out of a plurality of mounting heads 251 is used, and one suction nozzle 2511 out of a plurality of suction nozzles 2511 is used. In other words, for each component mounting operation by the mounting head 251, the mounting machine 1, the mounting stage 232, the mounting head 251, and the suction nozzle 2511 to be used are uniquely determined. Thus, each suction position shift data D1 acquired by the mounting analysis unit 46 for each component mounting operation by the mounting head 251 and each of parameters recorded in the mounting machine information D21, stage information D22, head information D23, and nozzle information D24 that make up the related information D2 are associated with each other.

The board transfer control unit 42 controls an operation of transferring the board PP by the board transfer unit 23 including the mounting stage 232, according to the stage information D22 of the board data D20. The component supply control unit 43 controls respective component supply operations of the plurality of feeders 24F arranged in the component supply unit 24, according to the component information D26 and the feeder information D25 of the board data D20. The head control unit 44 controls the head unit 25 according to the component information D26, head information D23, nozzle information D24, target suction position information DAP, and target mounting position information DPP of the board data D20, thereby controlling the mounting head 251. The head control unit 44 thus causes the mounting head 251 to execute the component mounting operation of mounting a component sucked and held by the suction nozzle 2511 on the board PP, correspondingly at each of the plurality of target mounting positions set on the board PP. The imaging control unit 45 controls imaging operations, i.e., imaging by the first imaging unit 31, the second imaging unit 32, and the third imaging unit 33 that make up the mounting imaging unit 3.

Based on the first component recognition image acquired by the first imaging unit 31, the mounting analysis unit 46 analyzes a suction position shift indicating a positional shift of an actual suction position of a component sucked by the suction nozzle 2511 relative to a target suction position indicated by the target suction position information DAP. The mounting analysis unit 46 then acquires suction position shift data D1 on the suction position shift for each component mounting operation by the mounting head 251. The suction position shift data D1 acquired by the mounting analysis unit 46 for each component mounting operation, the suction position shift data D1 being associated with the related information D2, is outputted to the management device 6 via the mounting communication unit 40.

Figure 5:
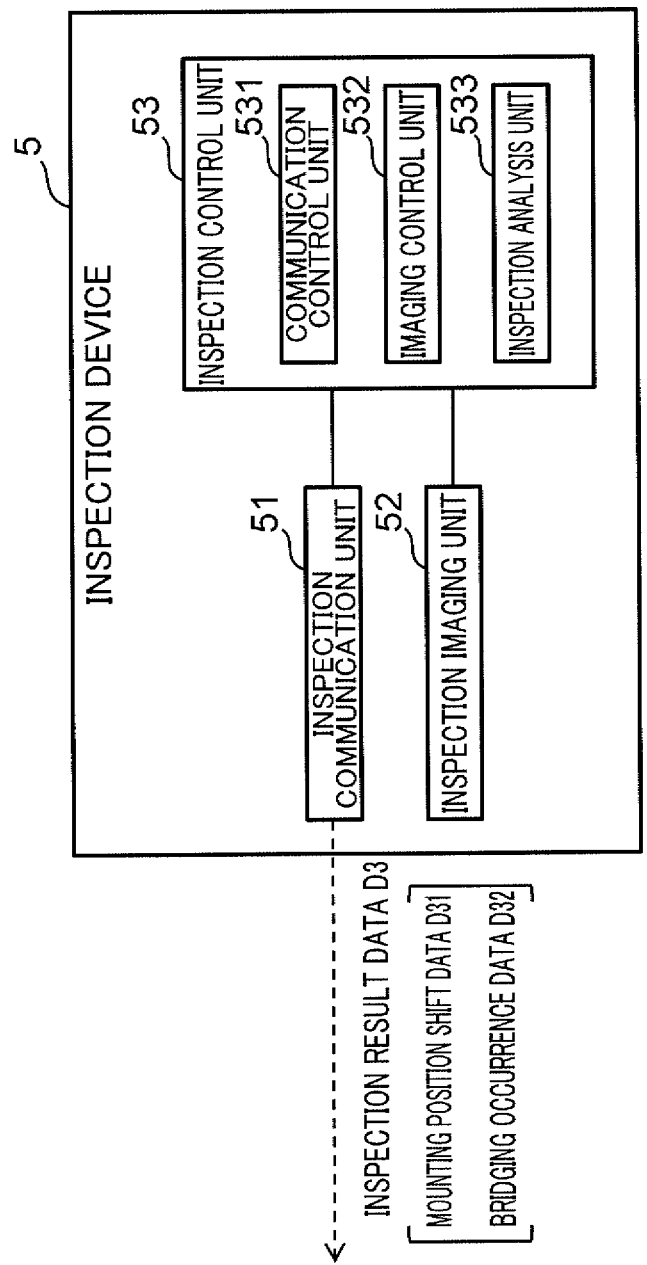
FIG. 5 is a block diagram of an inspection device included in the component mounting system.

The component mounting board PPS produced by the mounting machine 1 is transferred to the inspection device 5 by the board transfer unit 23. The inspection device 5 is a device that inspects the component mounting board PPS. A configuration of the inspection device 5 will be described with reference to a block diagram of FIG. 5. The inspection device 5 includes an inspection communication unit 51, an inspection imaging unit 52, and an inspection control unit 53.

The inspection communication unit 51 is an interface that carries out data communication with the management device 6, functioning as an inspection output unit that outputs various pieces of data and information to the management device 6. The inspection communication unit 51 outputs various pieces of inspection result data D3 acquired by the inspection analysis unit 533, which will be described later, to the management device 6. Inspection result data D3, which will be described in detail later, includes each mounting position shift data D31 and bridging occurrence data D32. Each mounting position shift data D31 is data on a mounting position shift indicating a positional shift of an actual mounting position of a component on the component mounting board PPS (actual mounting position) relative to a target mounting position indicated by the target mounting position information DPP. Each mounting position shift data D31 is associated with the related information D2 in the same manner as each suction position shift data D1 outputted from the mounting communication unit 40 is. The bridging occurrence data D32 is data indicating the status of occurrence of bridging that refers to short-circuiting between lead terminals of a lead component having a plurality of lead terminals, the lead component being one of components mounted on the component mounting board PPS.

The inspection imaging unit 52 is, for example, an imaging camera equipped with an imaging element, such as a CMOS or a CCD. The inspection imaging unit 52 photographs the component mounting board PPS from above, which is transferred from the mounting machine 1, to acquire an inspection image.

The inspection control unit 53 includes a CPU, a ROM storing control programs, and a RAM used as a work area for the CPU. As a result of the CPU's executing control programs stored in the ROM, the inspection control unit 53 controls the inspection communication unit 51 and the inspection imaging unit 52 and executes various computations. The inspection control unit 53 includes main functional constituent elements a communication control unit 531, an imaging control unit 532, and the inspection analysis unit 533.

The communication control unit 531 controls the inspection communication unit 51, thereby controlling data communication between the inspection device 5 and the management device 6. The imaging control unit 532 controls an imaging operation, i.e., imaging by the inspection imaging unit 52.

Based on an inspection image obtained by the inspection imaging unit 52, the inspection analysis unit 533 analyzes a component mounted at an actual mounting position on the component mounting board PPS, to examine various inspection items related to the component, such as a mounting position shift and a bridging occurrence status. The inspection analysis unit 533 then acquires various pieces of inspection result data D3 indicating analysis results on various inspection items. For example, the inspection analysis unit 533 analyzes each mounting position shift indicating a positional shift of the actual mounting position of the component on the component mounting board PPS relative to each of a plurality of target mounting positions indicated by the target mounting position information DPP. In this case, the inspection analysis unit 533 acquires the mounting position shift data D31 on the mounting position shift, for each of the plurality of target mounting positions set on the board PP. Based on an inspection image, the inspection analysis unit 533 analyzes also a lead component mounted on the component mounting board PPS to examine the status of occurrence of bridging that refers to short-circuiting between lead terminals. In this case, when determined that bridging has occurred, the inspection analysis unit 533 acquires the bridging occurrence data D32 indicating the occurrence of bridging. The inspection result data D3, which includes each mounting position shift data D31 and the bridging occurrence data D32 that are acquired by the inspection analysis unit 533, is outputted to the management device 6 via the inspection communication unit 51.

The management device 6 is connected to the mounting machine 1 and the inspection device 5 so as to enable data communication therewith, and is configured of, for example, a microcomputer. The management device 6 receives input of each suction position shift data D1 and the related information D2, which are outputted from the mounting communication unit 40 of the mounting machine 1, and of the inspection result data D3 including each mounting position shift data D31 and the bridging occurrence data D32, the inspection result data D3 being outputted from the inspection communication unit 51 of the inspection device 5. The management device 6 is a device that is used to confirm a tendency of suction position shift based on each suction position shift data D1 and a tendency of mounting position shift based on each mounting position shift data D31. Confirmation of these tendencies of positional shifts is carried out by an operator, using the management device 6.

Figure 6:
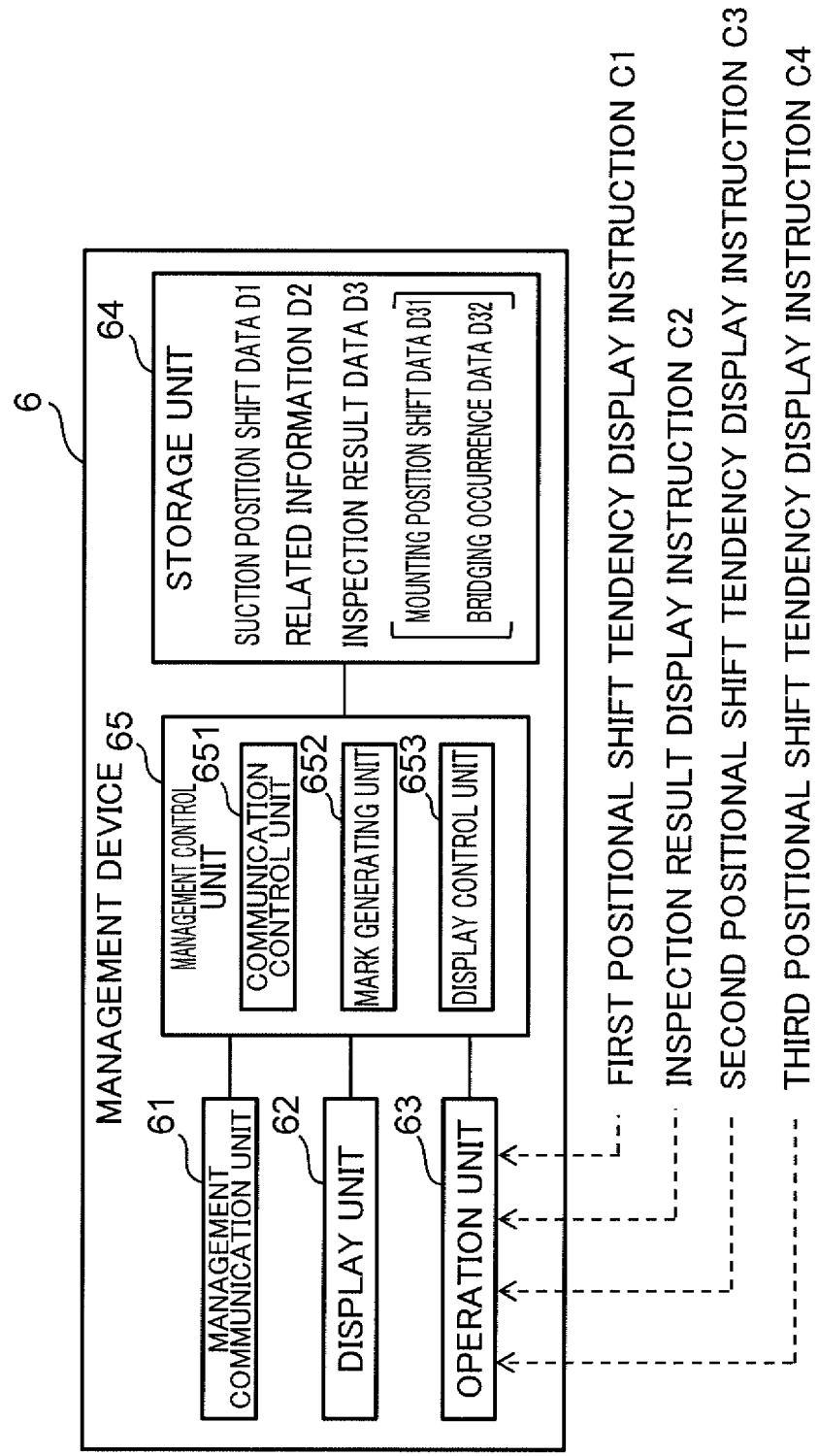
FIG. 6 is a block diagram of a management device included in the component mounting system.

A configuration of the management device 6 will be described with reference to a block diagram of FIG. 6. The management device 6 includes a management communication unit 61, a display unit 62, an operation unit 63, a storage unit 64, and a management control unit 65. The management control unit 65 includes functional constituent elements a communication control unit 651, a mark generating unit 652, and a display control unit 653.

The management communication unit 61 is an interface that carries out data communication with the mounting machine 1 and with the inspection device 5, and receives input of each suction position shift data D1 and the related information D2, which are outputted from the mounting machine 1, and of the inspection result data D3 including each mounting position shift data D31, the inspection result data D3 being outputted from the inspection device 5. Data communication between the management device 6 and the mounting machine 1 and inspection device 5, the data communication being carried out through the management communication unit 61, is controlled by the communication control unit 651.

The storage unit 64 stores and accumulates data and information inputted to the management device 6 through the management communication unit 61 in such a way as to associate each suction position shift data D1 and the inspection result data D3 including each mounting position shift data D31 with each of the plurality of pieces of parameter information making up the related information D2.

The display unit 62 is configured of, for example, a liquid crystal display or the like. The display unit 62 displays information for confirming the tendency of suction position shift based on each suction position shift data D1 and information for confirming the tendency of mounting position shift based on each mounting position shift data D31. The display unit 62 is controlled in its display operations by the display control unit 653.

The operation unit 63 is configured of a keyboard, a mouse, a touch panel, and the like, and receives an operator's input operations for inputting various instructions. The operation unit 63 receives input of various instructions including a first positional shift tendency display instruction C1, an inspection result display instruction C2, a second positional shift tendency display instruction C3, and a third positional shift tendency display instruction C4. The first positional shift tendency display instruction C1 is an instruction that causes the display unit 62 to display a tendency of suction position shift or of mounting position shift corresponding to production by the mounting machine 1 of one second component mounting board PPS. The inspection result display instruction C2 is an instruction that causes the display unit 62 to display various pieces of inspection result data D3. The second positional shift tendency display instruction C3 is an instruction that when the mounting machine 1 produces a plurality of component mounting boards PPS, using boards PP of the same type, causes the display unit 62 to display an overall tendency of suction position shift or of mounting position shift corresponding to production of the plurality of component mounting boards PPS of the same type. The third positional shift tendency display instruction C4 is an instruction that when the mounting machine 1 produces a plurality of component mounting boards PPS of different types, using boards PP of different types, causes the display unit 62 to display an overall tendency of suction position shift or of mounting position shift corresponding to production of the plurality of component mounting boards PPS of different types.

Based on various pieces of data stored in the storage unit 64, the mark generating unit 652 generates various marks corresponding to instructions received by the operation unit 63, the marks being put on the display unit 62. For example, the mark generating unit 652 generates a mark that visualizes a tendency of suction position shift, based on each suction position shift data D1, and generates a mark that visualizes a tendency of mounting position shift, based on each mounting position shift data D31. The mark generating unit 652 generates also a mark that visualizes various pieces of inspection result data D3.

Figure 7:
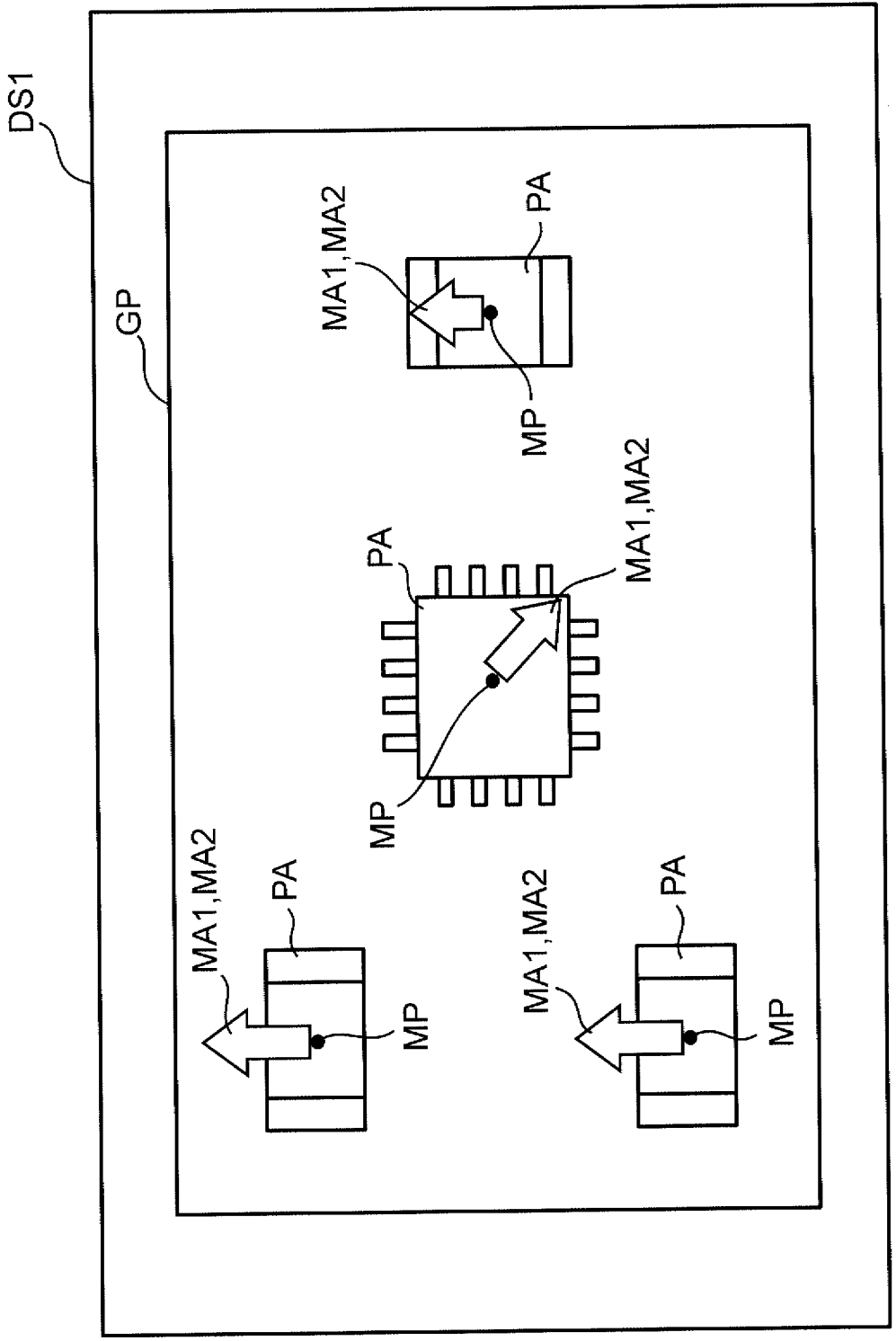
FIG. 7 depicts a display screen of a display unit included in the management device, showing a display state that results when a first positional shift tendency display instruction is received by an operation unit.
Figure 8:
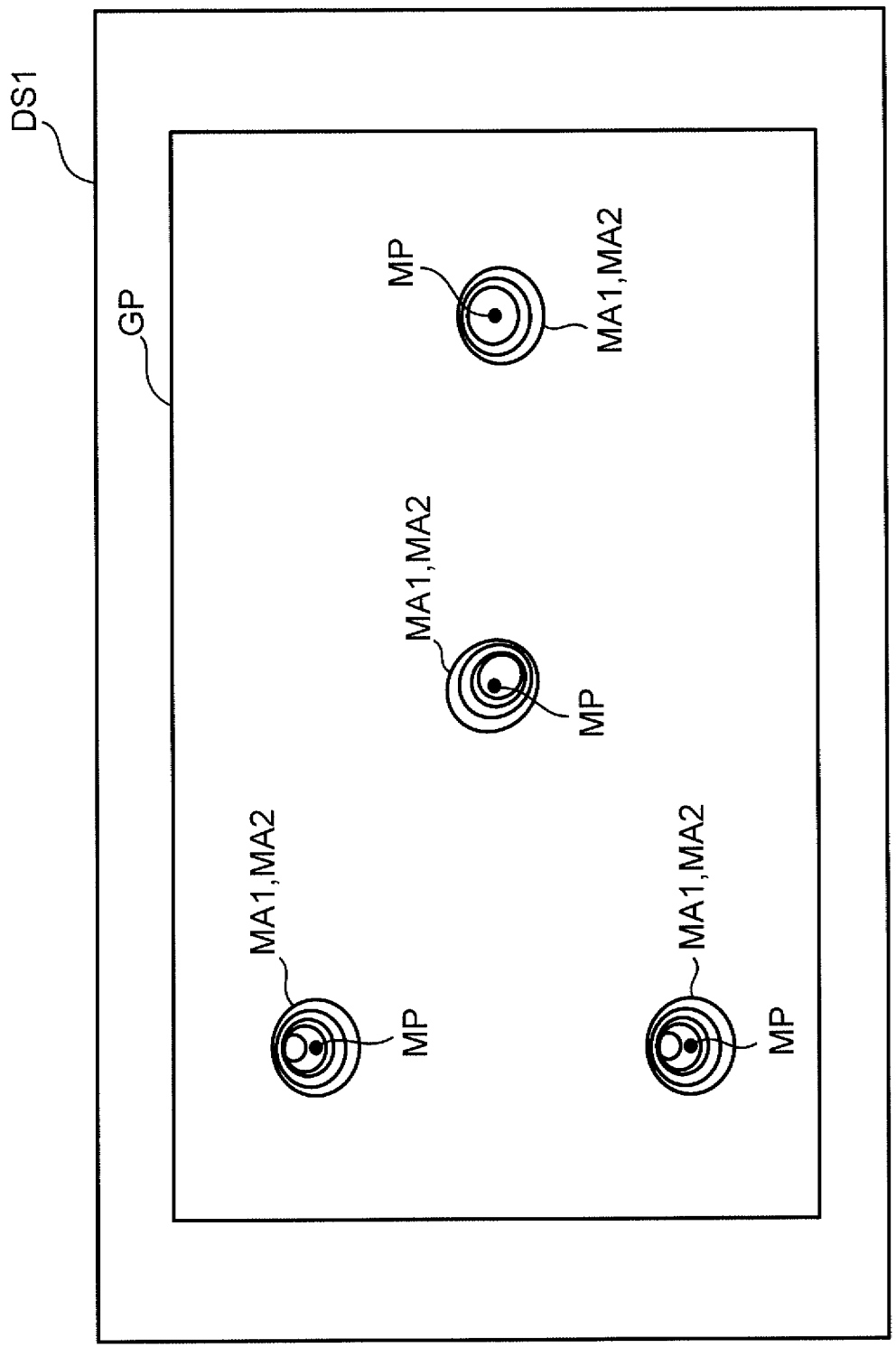
FIG. 8 depicts another example of suction shift marks and mounting shift marks displayed on the display unit.

FIG. 7 depicts a display screen DS1 of the display unit 62, showing a display state that results when the first positional shift tendency display instruction C1 is received by the operation unit 63. FIG. 8 depicts another example of suction shift marks MA1 and mounting shift marks MA2 displayed on the display unit 62. When input of the first positional shift tendency display instruction C1 is received by the operation unit 63, the mark generating unit 652 generates each suction shift mark MA1 that visualizes the direction and size of each suction position shift indicated by each suction position shift data D1 and each mounting shift mark MA2 that visualizes the direction and size of each mounting position shift indicated by each mounting position shift data D31.

Each suction shift mark MA1 is not limited in shape, and may be of any shape providing that the suction shift mark MA1 visualizes the direction and size of each suction position shift. Likewise, each mounting shift mark MA2 is not limited in shape, and may be of any shape providing that the mounting shift mark MA2 visualizes the direction and size of each mounting position shift. For example, each suction shift mark MA1 and each mounting shift mark MA2 may be expressed as an arrow, as shown in FIG. 7. In this case, the direction of the suction position shift and that of the mounting position shift are each indicated as the direction of the arrow, while the size of the suction position shift and that of the mounting position shift are each indicated by the length of the arrow. As the suction position shift and the mounting position shift increase in size, therefore, the arrows increases in length. In an example shown in FIG. 8, the suction shift marks MA1 and the mounting shift marks MA2 are each expressed as a plurality of lines contouring a double or triple circle or ellipse converging toward an inner point. In this case, the direction of the suction position shift and that of the mounting position shift are each indicated by the position of a point of the highest density of lines making up the plurality of lines, relative to the center of the mark, while the size of the suction position shift and that of the mounting position shift are each indicated by the overall expanse of the group of lines (the overall size of the mark MA1 and of the mark MA2). As the suction position shift and the mounting position shift increase in size, the overall expanse of the group of lines increases, that is, the suction shift mark MA1 and the mounting shift mark MA2 increase in size.

When the mark generating unit 652 generates each suction shift mark MA1 and each mounting shift mark MA2, the display control unit 653 causes the display unit 62 to display board graphics GP corresponding to the board PP on the display screen DS1. At this time, as shown in FIG. 7, the display control unit 653 may control the display unit 62 so that a component graphic figure PA corresponding to a component is displayed on the board graphics GP. The display control unit 653 further controls the display unit 62 so that on the board graphics GP, each suction shift mark MA1 or each mounting shift mark MA2 is displayed at each marking position MP corresponding to each of the plurality of target mounting positions set on the board PP.

Each of the suction shift mark MA1 and the mounting shift mark MA2 visualizes the direction and size of a positional shift. Based on the marks MA1 and MA2 displayed on the display unit 62, therefore, the operator is able to easily confirm a tendency of mounting position shift on the board PP as a whole and a tendency of suction position shift, which could be a cause of the mounting position shift.

As described above, each suction position shift data D1 and each mounting position shift data D31 are associated with each of a plurality of parameters recorded respectively in the mounting machine information D21, the stage information D22, the head information D23, and the nozzle information D24 that make up the related information D2. Each suction shift mark MA1 visualizes the tendency of each suction position shift indicated by each suction position shift data D1 and each mounting shift mark MA2 visualizes the tendency of each mounting position shift indicated by each mounting position shift data D31. It follows from this fact that each suction shift mark MA1 and each mounting shift mark MA2 are associated with the plurality of pieces of parameter information making up the related information D2.

As shown in FIGS. 9 to 12, the display control unit 653 may pay attention to a specific parameter selected from the plurality of parameters making up the related information D2 and control the display unit 62 so that each suction shift mark MA1 or each mounting shift mark MA2 is displayed in a different display mode on the board graphics GP, for each type of the specific parameter corresponding to each mark. The specific parameter is selected by the operator's input operation on the operation unit 63. Since the plurality of parameters making up the related information D2 are associated with each suction position shift data D1 and with each mounting position shift data D31, the parameters could be a cause of a suction position shift and a mounting position shift. By confirming each suction shift mark MA1 or each mounting shift mark MA2 displayed in a different display mode for each type of a specific parameter, therefore, the operator is able to easily confirm the tendency of mounting position shift and the tendency of suction position shift for each type of the specific parameter while paying attention to the type of the specific parameter that could be a cause of a positional shift.

Figure 9:
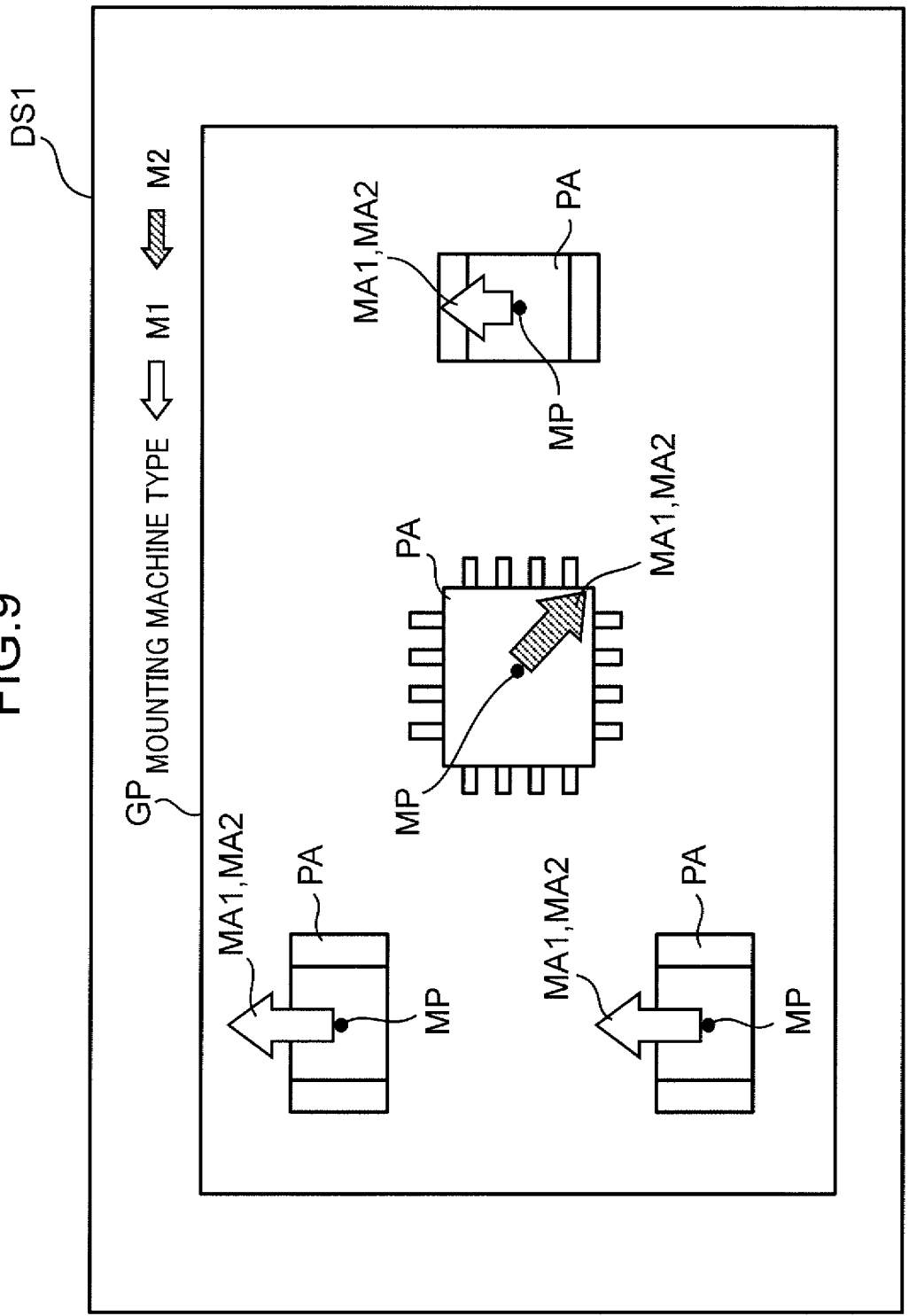
FIG. 9 depicts a state in which suction shift marks or mounting shift marks are each displayed in a different display mode for each type of a mounting machine on a display screen of the display unit.

FIG. 9 shows an example of a display that the display unit 62 makes when a parameter for specifying the type of the mounting machine 1, the parameter being recorded in the mounting machine information D21 making up the related information D2, is selected as a specific parameter. In this case, on the board graphics GP on the display screen DS1 of the display unit 62, each suction shift mark MA1 or each mounting shift mark MA2 is displayed in a different display mode for each type of the mounting machine 1. For example, the display control unit 653 controls the display unit 62 so that a suction shift mark MA1 or mounting shift mark MA2 corresponding to a type M1 representing a type of the mounting machine 1 is different in display color from a suction shift mark MA1 or mounting shift mark MA2 corresponding to a type M2 representing a different type of the mounting machine 1.

Figure 10:
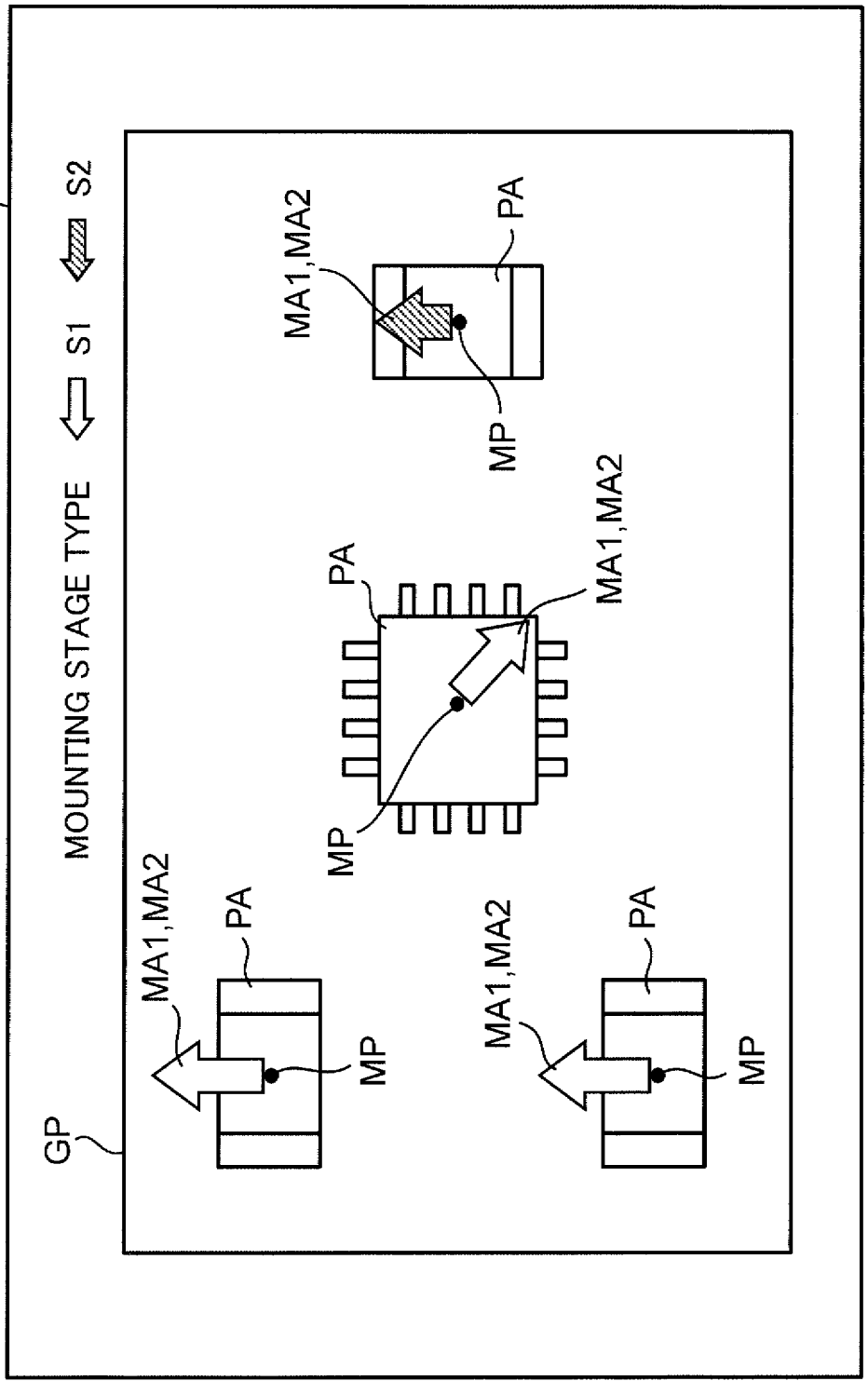
FIG. 10 depicts a state in which suction shift marks or mounting shift marks are each displayed in a different display mode for each type of a mounting stage on a display screen of the display unit.

FIG. 10 shows an example of a display that the display unit 62 makes when a parameter for specifying the type of the mounting stage 232, the parameter being recorded in the stage information D22 making up the related information D2, is selected as a specific parameter. In this case, on the board graphics GP on the display screen DS1 of the display unit 62, each suction shift mark MA1 or each mounting shift mark MA2 is displayed in a different display mode for each type of the mounting stage 232. For example, the display control unit 653 controls the display unit 62 so that a suction shift mark MA1 or mounting shift mark MA2 corresponding to a type S1 representing a type of the mounting stage 232 is different in display color from a suction shift mark MA1 or mounting shift mark MA2 corresponding to a type S2 representing a different type of the mounting stage 232.

Figure 11:
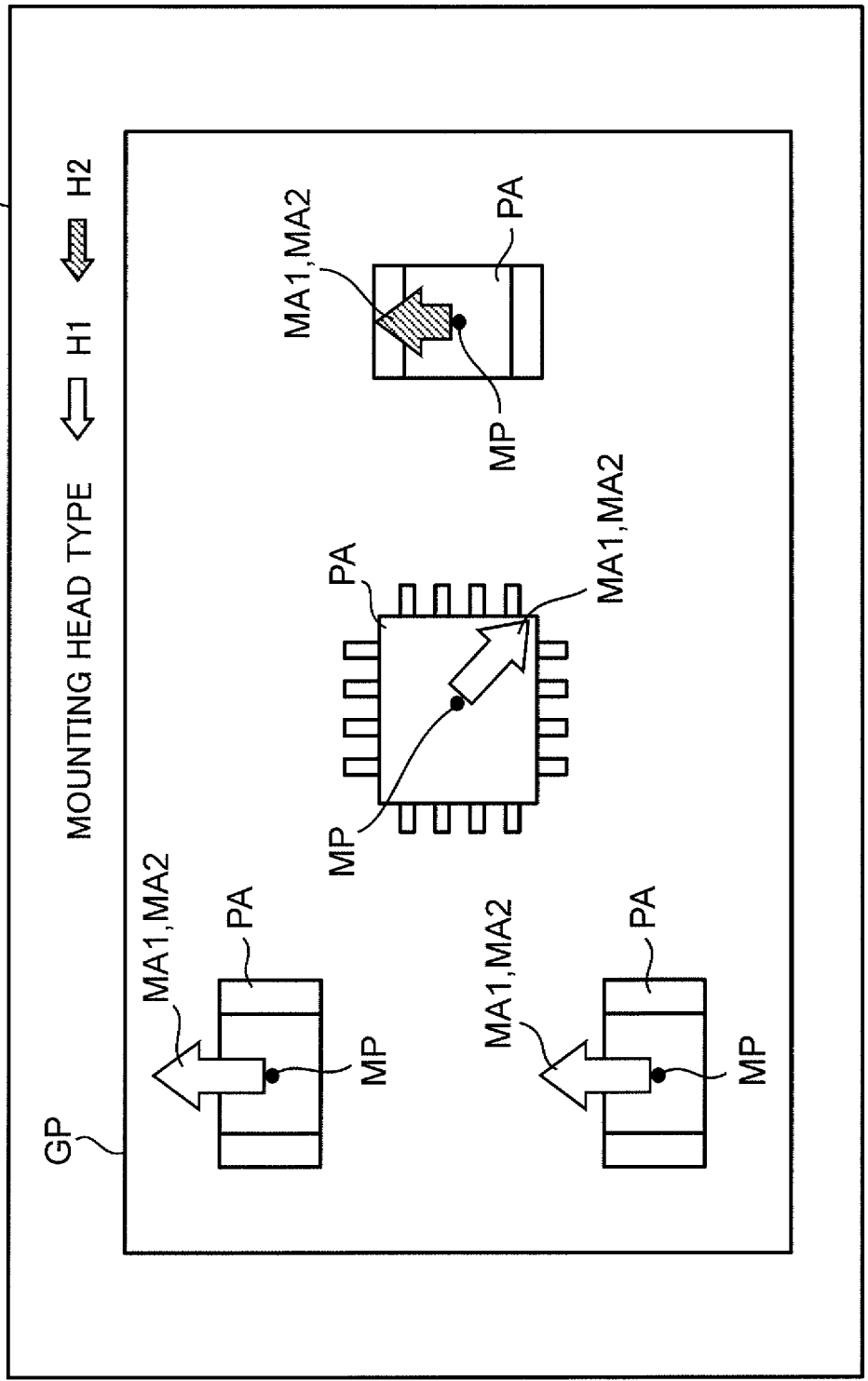
FIG. 11 depicts a state in which suction shift marks or mounting shift marks are each displayed in a different display mode for each type of a mounting head on a display screen of the display unit.

FIG. 11 shows an example of a display that the display unit 62 makes when a parameter for specifying the type of the mounting head 251, the parameter being recorded in the head information D23 making up the related information D2, is selected as a specific parameter. In this case, on the board graphics GP on the display screen DS1 of the display unit 62, each suction shift mark MA1 or each mounting shift mark MA2 is displayed in a different display mode for each type of the mounting head 251. For example, the display control unit 653 controls the display unit 62 so that a suction shift mark MA1 or mounting shift mark MA2 corresponding to a type H1 representing a type of the mounting head 251 is different in display color from a suction shift mark MA1 or mounting shift mark MA2 corresponding to a type H2 representing a different type of the mounting head 251.

Figure 12:
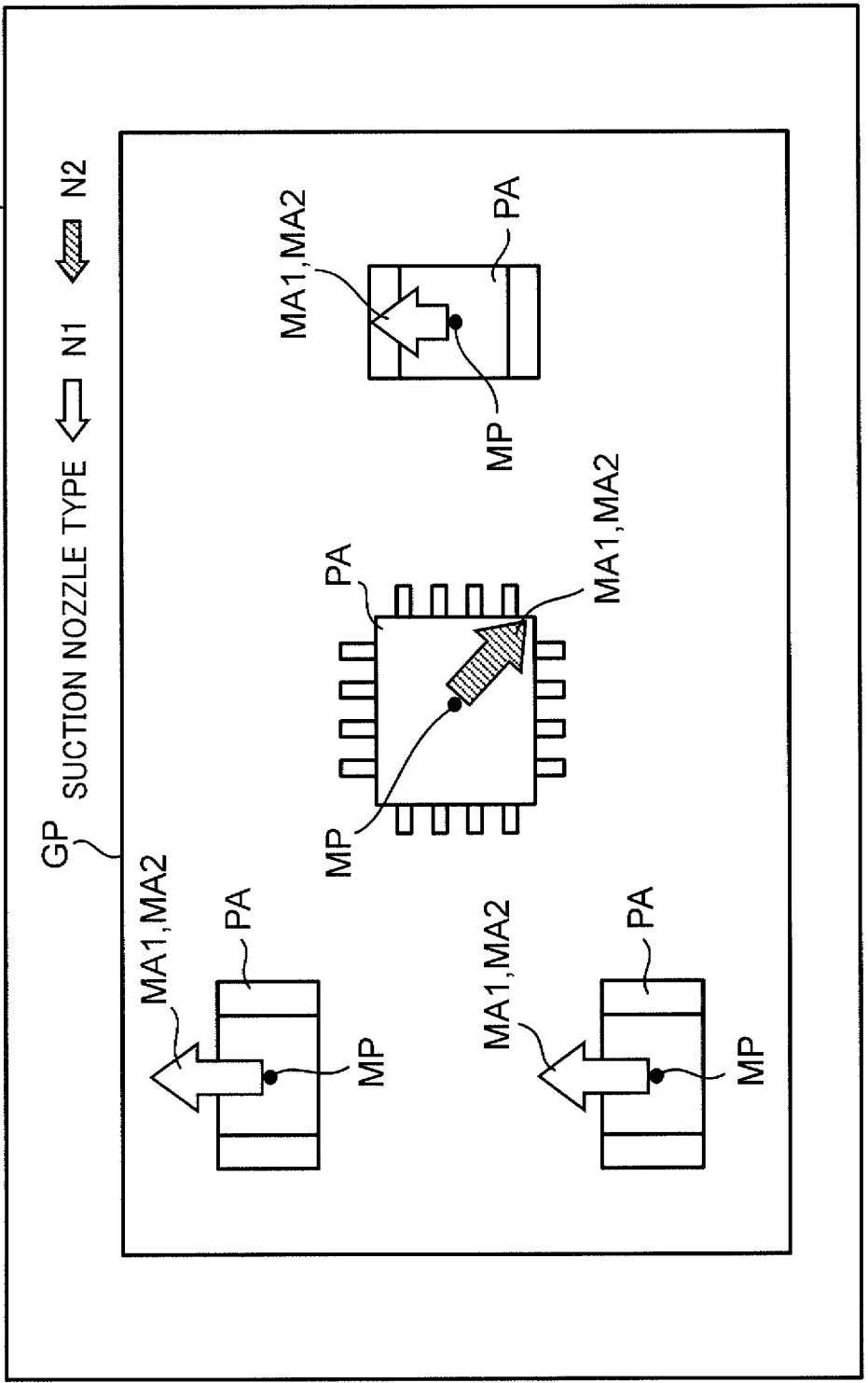
FIG. 12 depicts a state in which suction shift marks or mounting shift marks are each displayed in a different display mode for each type of a suction nozzle on a display screen of the display unit.

FIG. 12 shows an example of a display that the display unit 62 makes when a parameter for specifying the type of the suction nozzle 2511, the parameter being recorded in the nozzle information D24 making up the related information D2, is selected as a specific parameter. In this case, on the board graphics GP on the display screen DS1 of the display unit 62, each suction shift mark MA1 or each mounting shift mark MA2 is displayed in a different display mode for each type of the suction nozzle 2511. For example, the display control unit 653 controls the display unit 62 so that a suction shift mark MA1 or mounting shift mark MA2 corresponding to a type N1 representing a type of the suction nozzle 2511 is different in display color from a suction shift mark MA1 or mounting shift mark MA2 corresponding to a type N2 representing a different type of the suction nozzle 2511.

In some cases, the frequency of occurrence of suction position shifts and mounting position shifts is different for each type of the mounting machine 1. A degree of tilt or the like of the mounting stage 232 affects a mounting position shift. Operation characteristics of the suction nozzle 2511 and the mounting head 251 affect a suction position shift and a mounting position shift. In other words, respective types of the mounting machine 1, the mounting stage 232, the mounting head 251, and the suction nozzle 2511 could constitute a cause of a suction position shift or a mounting position shift. In the above manner, each suction shift mark MA1 or each mounting shift mark MA2 is displayed in a different display mode on the display unit 62, for each type of the mounting machine 1, the mounting stage 232, the mounting head 251, and the suction nozzle 2511. This allows the operator to easily confirm the tendency of mounting position shift and the tendency of suction position shift. By confirming such positional shift tendencies, the operator is able to take appropriate measures for eliminating a problem of suction position shifts and mounting position shifts. For example, as a countermeasure for eliminating the problem of suction position shifts and mounting position shifts, the operator carries out work of adjusting operations of the suction nozzle 2511 and the mounting head 251.

Figure 13:
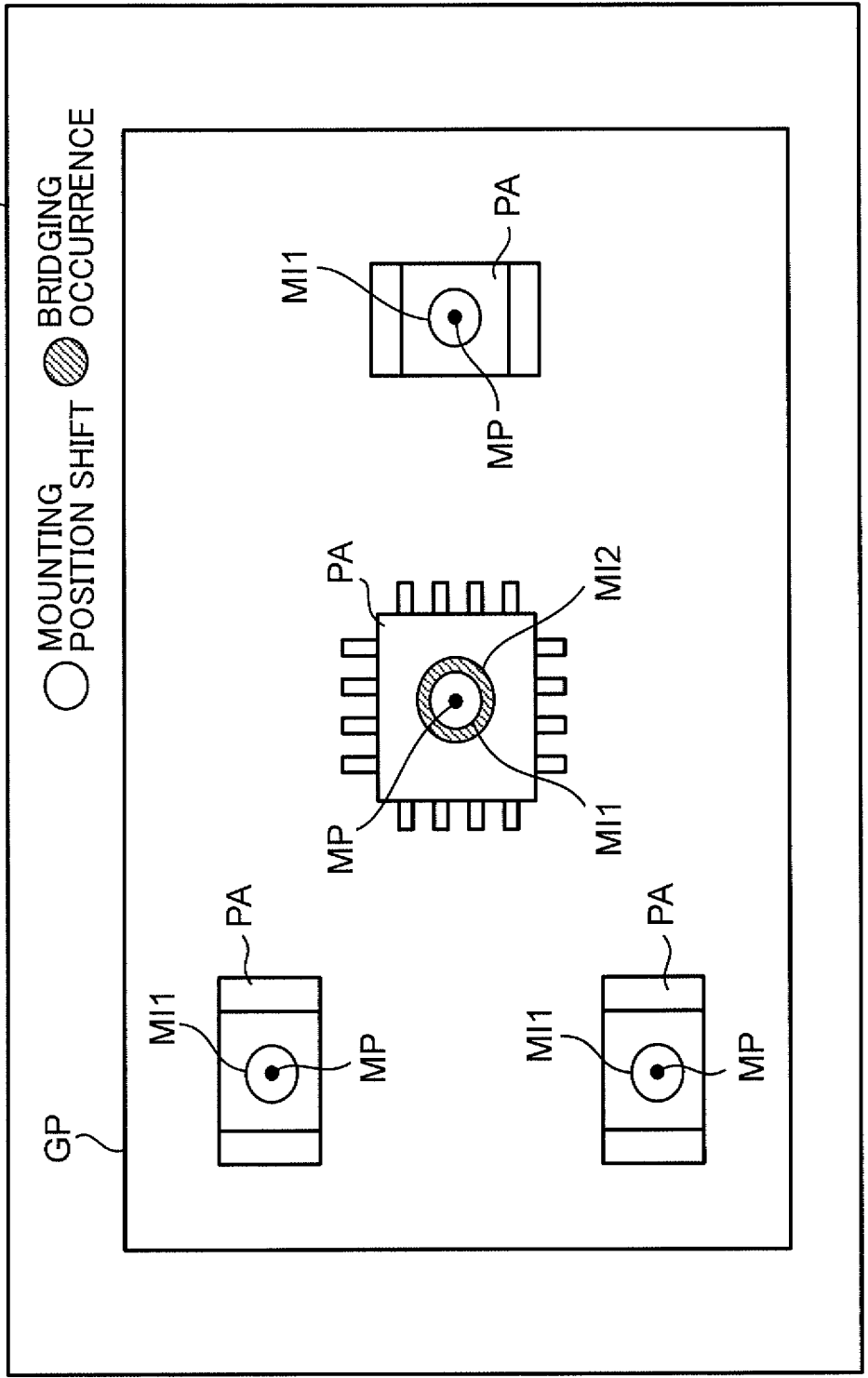
FIG. 13 depicts a display screen of the display unit, showing a display state that results when an inspection result display instruction is received by the operation unit.

FIG. 13 depicts a display screen DS2 of the display unit 62, showing a display state that results when input of the inspection result display instruction C2 is received by the operation unit 63. When input of the inspection result display instruction C2 is received by the operation unit 63, the mark generating unit 652 generates a first inspection result mark MI1, a second inspection result mark MI2, and the like that visualize various pieces of inspection result data D3 acquired by the inspection analysis unit 533. The first inspection result mark MI1 is a mark that visualizes the mounting position shift data D31 included in the inspection result data D3, and is expressed as, for example, a circular figure of a specific color. The second inspection result mark MI2 is a mark that visualizes the bridging occurrence data D32 included in the inspection result data D3, and is expressed as, for example, a circular figure that is larger than the first inspection result mark MI1 and that is different in color from the first inspection result mark MI1.

When the mark generating unit 652 generates the first inspection result mark MI1, the second inspection result mark MI2, and the like, the display control unit 653 controls the display unit 62 so that the first inspection result mark MI1, the second inspection result mark MI2, and the like are displayed respectively at marking positions MP on the board graphics GP. Based on inspection result marks, such as the first inspection result mark MI1 and the second inspection result mark MI2, displayed on the display unit 62, the operator is able to easily confirm inspection results of various inspection items.

Figure 14:
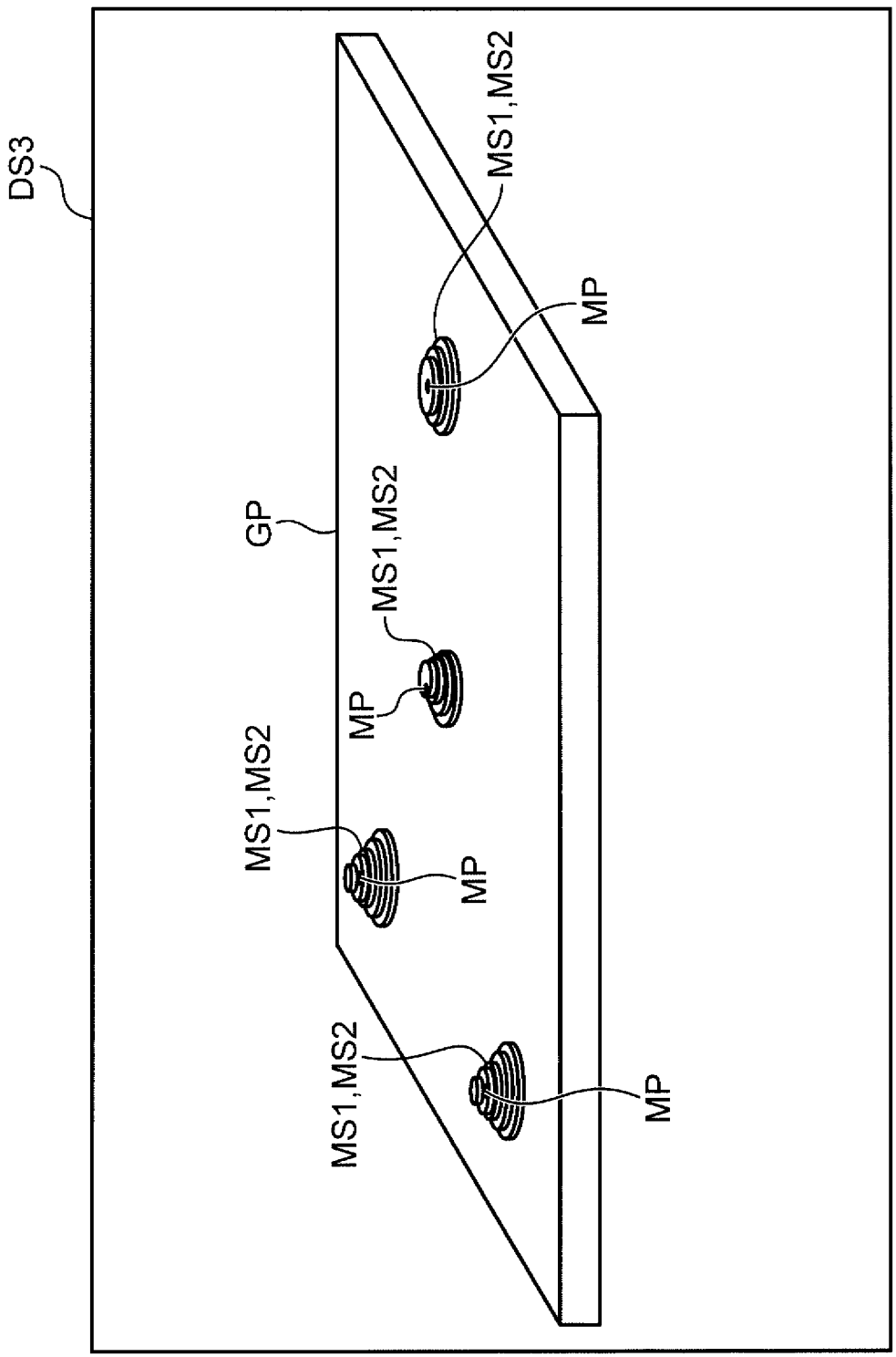
FIG. 14 depicts a display screen of the display unit, showing a display state that results when a second positional shift tendency display instruction is received by the operation unit.

FIG. 14 depicts a display screen DS3 of the display unit 62, showing a display state that results when input of the second positional shift tendency display instruction C3 is received by the operation unit 63. When input of the second positional shift tendency display instruction C3 is received by the operation unit 63, the mark generating unit 652 generates a plurality of sets of suction shift marks MA1 according to the number of component mounting boards PPS produced by using a plurality of boards PP of the same type. Based on the plurality of sets of suction shift marks MA1, the mark generating unit 652 generates three-dimensional suction shift marks MS1 each of which is a three-dimensional figure that, in addition to visualizing the direction and size of a suction position shift, visualizes the frequency of suction position shifts as a three-dimensional height. The mark generating unit 652 generates also a plurality of sets of mounting shift marks MA2 according to the number of component mounting boards PPS produced by using a plurality of boards PP of the same type. Based on the plurality of sets of mounting shift marks MA2, the mark generating unit 652 generates three-dimensional mounting shift marks MS2 each of which is a three-dimensional figure that, in addition to visualizing the direction and size of a mounting position shift, visualizes the frequency of mounting position shifts as a three-dimensional height.

In the example shown in FIG. 14, the mark generating unit 652 generates marks each shown as a group of lines, i.e., a combination of a plurality of lines in FIG. 8, as the plurality of sets of suction shift marks MA1 and of mounting shift marks MA2, and based on these marks, generates the three-dimensional suction shift marks MS1 and three-dimensional mounting shift marks MS2 each expressed as a three-dimensional figure. In this case, the direction of a suction position shift and that of a mounting position shift of a plurality of boards PP of the same type as a whole are each indicated by the position of a point of the highest density of a plurality of lines making up the group of lines, relative to the center of the mark, the size of the suction position shift and that of the mounting position shift are indicated respectively by the plane size of the three-dimensional suction shift mark MS1 and that of the three-dimensional mounting shift mark MS2, and the frequency of suction position shifts and that of mounting position shifts are indicated respectively by the height of the three-dimensional suction shift mark MS1 and that of the three-dimensional mounting shift mark MS2.

When the mark generating unit 652 generates each three-dimensional suction shift mark MS1 and each three-dimensional mounting shift mark MS2, the display control unit 653 causes the display unit 62 to display board graphics GP on the display screen DS3, the board graphics GP being a three-dimensional figure corresponding to the board PP. In addition, the display control unit 653 controls the display unit 62 so that each three-dimensional suction shift mark MS1 and each three-dimensional mounting shift mark MS2 are displayed respectively at marking positions MP on the board graphics GP.

Each of the three-dimensional suction shift mark MS1 and the three-dimensional mounting shift mark MS2 visualizes the direction and size of a positional shift and visualizes the frequency of positional shifts as well. Based on each three-dimensional suction shift mark MS1 or each three-dimensional mounting shift mark MS2 displayed on the display unit 62, therefore, the operator is able to easily confirm a tendency of mounting position shift or a tendency of suction position shift on a plurality of boards PP of the same type as a whole when a plurality of component mounting boards PPS of the same type are produced.

Figure 15:
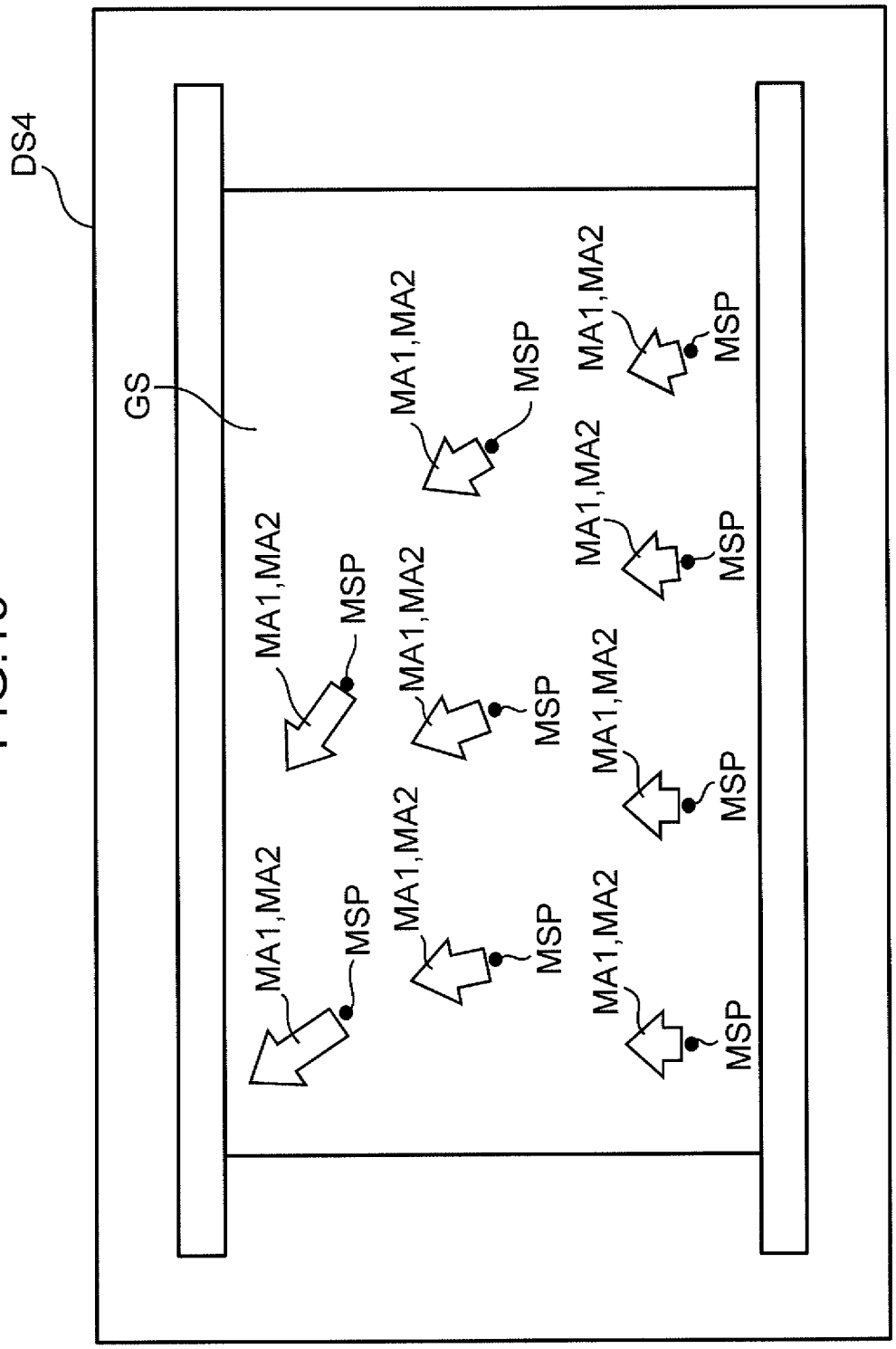
FIG. 15 depicts a display screen of the display unit, showing a display state that results when a third positional shift tendency display instruction is received by the operation unit.

FIG. 15 depicts a display screen DS4 of the display unit 62, showing a display state that results when input of the third positional shift tendency display instruction C4 is received by the operation unit 63. When input of the third positional shift tendency display instruction C4 is received by the operation unit 63, the mark generating unit 652 generates each suction shift mark MA1 and each mounting shift mark MA2 for each unit of production of a plurality of component mounting boards PPS of different types produced by using different types of boards PP.

When the mark generating unit 652 generates each suction shift mark MA1 and each mounting shift mark MA2 for each unit of production of the plurality of component mounting boards PPS of different types, the display control unit 653 causes the display unit 62 to display stage graphics GS on a display screen DS4, the stage graphics GS corresponding to the mounting stage 232 bearing boards PP of different types. In addition, the display control unit 653 controls the display unit 62 so that on the stage graphics GS, each suction shift mark MA1 or each mounting shift mark MA2 for each unit of production of the plurality of component mounting boards PPS of different types is displayed at each stage marking position MSP corresponding to each of a plurality of target mounting positions set on each of boards PP of different types.

Based on each suction shift mark MA1 or each mounting shift mark MA2 displayed on the display unit 62, the operator is able to easily confirm a tendency of mounting position shift or a tendency of suction position shift caused by the mounting stage 232 that is used when the plurality of component mounting boards PPS are produced. By checking each suction shift mark MA1 or each mounting shift mark MA2 on the stage graphics GS, the operator is able to know a degree of tilt or the like of the mounting stage 232. Hence the operator is able to carry out work of adjusting the degree of tilt of the mounting stage 232, as a countermeasure for eliminating the problem of mounting position shift.

The above specific embodiments include aspects of the disclosure that offer configurations described below.

A component mounting system according to an aspect of the present disclosure is a system including a mounting machine that produces a component mounting board carrying components mounted on the board; an inspection device that inspects the component mounting board; and a management device connected to the mounting machine and the inspection device so as to enable data communication with the mounting machine and the inspection device. In this component mounting system, the mounting machine includes a mounting stage that holds the board; a mounting head having a suction nozzle capable of sucking and holding the component, the mounting head carrying out a component mounting operation of mounting the component sucked and held by the suction nozzle on the board on the mounting stage, correspondingly at each of a plurality of target mounting positions set on the board; a mounting analysis unit that analyzes a suction position shift indicating a positional shift of an actual suction position of the component relative to a target suction position, the positional shift being caused by the suction nozzle, to acquire suction position shift data on the suction position shift for the each component mounting operation by the mounting head; and a mounting output unit that outputs the each suction position shift data for the each component mounting operation. The inspection device includes an inspection analysis unit that analyzes each mounting position shift indicating a positional shift of an actual mounting position of the component relative to each of the plurality of target mounting positions on the component mounting board obtained by the component mounting operation by the mounting head, to acquire each mounting position shift data on the mounting position shift; and an inspection output unit that outputs the each mounting position shift data. The management device includes a mark generating unit that generates each suction shift mark visualizing a direction and a size of the each suction position shift indicated by the each suction position shift data and each mounting shift mark visualizing a direction and a size of the each mounting position shift indicated by the each mounting position shift data; and a display unit that displays board graphics corresponding to the board, the display unit displaying the each suction shift mark or the each mounting shift mark at each marking position corresponding to each of the plurality of target mounting positions on the board graphics.

According to this component mounting system, the mounting machine and the inspection device are connected to the management device so as to enable data communication therewith. In the mounting machine, the mounting analysis unit acquires suction position shift data on a suction position shift of a component caused by the suction nozzle for each component mounting operation by the mounting head. Each suction position shift data is outputted from the mounting output unit to the management device. In the inspection device, the inspection analysis unit acquires mounting position shift data on a mounting position shift of the component on the component mounting board, correspondingly for each of the plurality of target mounting positions set on the board. Each mounting position shift data is outputted from the inspection output unit to the management device. In the management device, the mark generating unit generates each suction shift mark that visualizes the direction and size of each suction position shift indicated by each suction position shift data, and each mounting shift mark that visualizes the direction and size of each mounting position shift indicated by each mounting position shift data. The display unit of the management device displays each suction shift mark or each mounting shift mark at each marking position corresponding to each of the plurality of target mounting positions on the board graphics corresponding to the board.

Each of the suction shift mark and the mounting shift mark visualizes the direction and size of a positional shift. Based on each mark displayed on the display unit, therefore, the operator is able to easily confirm a tendency of mounting position shift on the board as a whole and a tendency of suction position shift that could be a cause of the mounting position shift. By confirming such positional shift tendencies, the operator is able to take appropriate measures for eliminating a problem of suction position shifts and mounting position shifts.

In the above component mounting system, the mounting output unit may be configured to output related information including a plurality of pieces of parameter information each associated with the each suction position shift data and the each mounting position shift data. The display unit focuses on a specific parameter selected from a plurality of parameters, and displays the each suction shift mark or the each mounting shift mark on the board graphics, the each suction shift mark or the each mounting shift mark being displayed in a different display mode for each type of the specific parameter corresponding to the each mark.

In this mode, the display unit focuses on the specific parameter selected from the plurality of parameters constituting the related information, and displays each suction shift mark or each mounting shift mark in a different display mode for each type of the specific parameter corresponding to each mark. Since the plurality of parameters making up the related information are associated with each suction position shift data and with each mounting position shift data, the parameters could be a cause of a suction position shift and a mounting position shift. While paying attention to the type of the specific parameter that could be a cause of a positional shift, therefore, the operator is able to easily confirm the tendency of mounting position shift and the tendency of suction position shift for each type of the specific parameter.

In the above component mounting system, the plurality of pieces of parameter information may include mounting machine information in which a parameter for specifying a type of the mounting machine is recorded, stage information in which a parameter for specifying a type of the mounting stage is recorded, head information in which a parameter for specifying a type of the mounting head is recorded, and nozzle information in which a parameter for specifying a type of the suction nozzle is recorded.

In some cases, the frequency of occurrence of suction position shifts and mounting position shifts is different for each type of the mounting machine. A degree of tilt or the like of the mounting stage affects a mounting position shift. Operation characteristics of the suction nozzle and the mounting head affect a suction position shift and a mounting position shift. In other words, respective types of the mounting machine, the mounting stage, the mounting head, and the suction nozzle could constitute a cause of a suction position shift or a mounting position shift. Each suction shift mark or each mounting shift mark is displayed in a different display mode on the display unit, for each type of the mounting machine, the mounting stage, the mounting head, and the suction nozzle. This allows the operator to easily confirm the tendency of mounting position shift and the tendency of suction position shift.

In the above component mounting system, the management device may further include the operation unit that receives input of various instructions. The inspection analysis unit is configured to analyze the component mounted at the actual mounting position on the component mounting board to examine various inspection items including the mounting position shift, to acquire various pieces of inspection result data including the mounting position shift data. When input of a display instruction to display the various pieces of inspection result data is received by the operation unit, the mark generating unit generates an inspection result mark that visualizes each of the various pieces of inspection result data, and the display unit displays the inspection result marks respectively at the each marking positions on the board graphics.

According to this aspect, when input of the display instruction to display various pieces of inspection result data is received by the operation unit, the display unit displays the inspection result marks respectively at the marking positions on the board graphics, the inspection result marks visualizing the inspection result data. Based on each inspection result mark displayed on the display unit, the operator is able to easily confirm inspection results of various inspection items.

In the above component mounting system, the management device may further include the operation unit that receives input of various instructions. When input of a display instruction to display a tendency of the suction position shift or of the mounting position shift, the tendency corresponding to production of the plurality of component mounting boards, is received by the operation unit at the time of production of the plurality of component mounting boards by the mounting machine using the boards of the same type, the mark generating unit generates a plurality of sets of the suction shift marks according to the number of the component mounting boards produced and then, based on the plurality of sets of the suction shift marks, generates three-dimensional suction shift marks each expressed as a three-dimensional figure that, in addition to visualizing the direction and size of the suction position shift, visualizes the frequency of suction position shifts, as a three-dimensional height, and generates a plurality of sets of the mounting shift marks according to the number of the component mounting boards produced and then, based on the plurality of sets of mounting shift marks, generates three-dimensional mounting shift marks each expressed as a three-dimensional figure that, in addition to visualizing the direction and size of the mounting position shift, visualizes the frequency mounting position shifts, as a three-dimensional height. The display unit displays the each three-dimensional suction shift mark or the each three-dimensional mounting shift mark at the each marking position on the board graphics.

According to this aspect, when input of the display instruction to display the tendency of the suction position shift or of the mounting position shift, the tendency corresponding to production of the plurality of component mounting boards, is received by the operation unit, the display unit displays each three-dimensional suction shift mark or each three-dimensional mounting shift mark at each marking position on the board graphics. Each of the three-dimensional suction shift mark and the three-dimensional mounting shift mark visualizes the direction and size of a positional shift and visualizes the frequency of positional shifts as well. Based on each three-dimensional suction shift mark or each three-dimensional mounting shift mark displayed on the display unit, therefore, the operator is able to easily confirm a tendency of mounting position shift or a tendency of suction position shift on a plurality of boards of the same type as a whole when a plurality of component mounting boards of the same type are produced.

In the above component mounting system, the management device may further include the operation unit that receives input of various instructions. When input of a display instruction to display a tendency of the suction position shift or of the mounting position shift, the tendency corresponding to production of the plurality of component mounting boards, is received by the operation unit at the time of production of the plurality of component mounting boards by the mounting machine using the boards of different types, the mark generating unit generates the each suction shift mark and the each mounting shift mark for each unit of production of the plurality of component mounting boards of different types. The display unit displays stage graphics corresponding to the mounting stage bearing the boards of different types, and displays the each suction shift mark or the each mounting shift mark for the each unit of production, at each stage marking position on the stage graphics, the stage marking position corresponding to each of the plurality of target mounting positions set on each of the boards of different types.

According to this aspect, when input of the display instruction to display the tendency of the suction position shift or of the mounting position shift, the tendency corresponding to production of the plurality of component mounting boards, is received by the operation unit, the display unit displays each suction shift mark or each mounting shift mark for each unit of production of the plurality of component mounting boards of different types, at each stage marking position on the stage graphics corresponding to the mounting stage bearing the boards of different types. Based on each suction shift mark or each mounting shift mark displayed on the display unit, therefore, the operator is able to easily confirm a tendency of mounting position shift or a tendency of suction position shift caused by the mounting stage that is used at production of a plurality of component mounting boards of different types.

As described above, according to the present disclosure, a component mounting system that allows confirming a tendency of suction position shifts and of mounting position shifts on a board as a whole can be provided.

The invention claimed is:
1. A component mounting system comprising:
   a mounting machine configured to produce a component mounting board carrying a component mounted on the board;
   an inspection device configured to inspect the component mounting board; and
   a management device connected to the mounting machine and the inspection device so as to enable data communication with the mounting machine and the inspection device,
   wherein the mounting machine includes:
   a mounting stage configured to hold the board;
   a mounting head having a suction nozzle configured to suck and hold the component, the mounting head being configured to perform a component mounting operation of mounting the component sucked and held by the suction nozzle on the board on the mounting stage, correspondingly at each of a plurality of target mounting positions set on the board;
   a mounting analysis unit configured to analyze a suction position shift indicating a positional shift of an actual suction position of the component relative to a target suction position, the positional shift being caused by the suction nozzle, to acquire suction position shift data on the suction position shift for the each component mounting operation by the mounting head; and
   a mounting output unit configured to output the each suction position shift data for the each component mounting operation,
   the inspection device includes:
   an inspection analysis unit configured to analyze each mounting position shift indicating a positional shift of an actual mounting position of the component relative to each of the plurality of target mounting positions on the component mounting board obtained by the component mounting operation by the mounting head, to acquire each mounting position shift data on the mounting position shift; and
   an inspection output unit configured to output the each mounting position shift data, and
   the management device includes:
   a mark generating unit configured to generate each suction shift mark visualizing a direction and a size of the each suction position shift indicated by the each suction position shift data and each mounting shift mark visu- alizing a direction and a size of the each mounting position shift indicated by the each mounting position shift data; and a display configured to display board graphics corresponding to the board, the display being configured to display the each suction shift mark or the each mounting shift mark at each marking position corresponding to each of the plurality of target mounting positions on the board graphics.

2. The component mounting system according to claim 1, wherein the mounting output unit is configured to output related information including a plurality of pieces of parameter information each associated with the each suction position shift data and the each mounting position shift data, and the display is configured to focus on a specific parameter selected from the plurality of parameters, and display the each suction shift mark or the each mounting shift mark on the board graphics, the each suction shift mark or the each mounting shift mark being displayed in a different display mode for each type of the specific parameter corresponding to the each mark.

3. The component mounting system according to claim 2, wherein the plurality of pieces of parameter information includes mounting machine information in which a parameter for specifying a type of the mounting machine is recorded, stage information in which a parameter for specifying a type of the mounting stage is recorded, head information in which a parameter for specifying a type of the mounting head is recorded, and nozzle information in which a parameter for specifying a type of the suction nozzle is recorded.

4. The component mounting system according to claim 1, wherein the management device further includes an operation unit configured to receive input of various instructions, the inspection analysis unit is configured to analyze the component mounted at the actual mounting position on the component mounting board to examine various inspection items including the mounting position shift, to acquire various pieces of inspection result data including the mounting position shift data, and when an input of a display instruction to display the various pieces of inspection result data is received by the operation unit, the mark generating unit generates an inspection result mark that visualizes each of the various pieces of inspection result data, and the display displays the inspection result mark at the each marking position on the board graphics.

5. The component mounting system according to claim 1, wherein the management device further includes an operation unit configured to receive input of various instructions, when input of a display instruction to display a tendency of the suction position shift or of the mounting position shift, the tendency corresponding to production of the plurality of component mounting boards, is received by the operation unit at the time of production of the plurality of component mounting boards by the mounting machine using the boards of the same type, the mark generating unit generates a plurality of sets of the suction shift marks according to a number of the component mounting boards produced and then, based on the plurality of sets of the suction shift marks, generates three-dimensional suction shift marks each expressed as a three-dimensional figure that, in addition to visualizing a direction and a size of the suction position shift, visualizes a frequency of suction position shifts, as a three-dimensional height, and generates a plurality of sets of the mounting shift marks according to a number of the component mounting boards produced and then, based on the plurality of sets of mounting shift marks, generates three-dimensional mounting shift marks each expressed as a three-dimensional figure that, in addition to visualizing a direction and a size of the mounting position shift, visualizes a frequency mounting position shifts, as a three-dimensional height, and the display displays the each three-dimensional suction shift mark or the each three-dimensional mounting shift mark at the each marking position on the board graphics.

6. The component mounting system according to claim 1, wherein the management device further includes an operation unit configured to receive input of various instructions, when input of a display instruction to display a tendency of the suction position shift or of the mounting position shift, the tendency corresponding to production of the plurality of component mounting boards, is received by the operation unit at the time of production of the plurality of component mounting boards by the mounting machine using the boards of different types, the mark generating unit generates the each suction shift mark and the each mounting shift mark for each unit of production of the plurality of component mounting boards of different types, and the display displays stage graphics corresponding to the mounting stage bearing the boards of different types, and displays the each suction shift mark or the each mounting shift mark for the each unit of production, at each stage marking position on the stage graphics, the stage marking position corresponding to each of the plurality of target mounting positions set on each of the boards of different types.

* * * * *